United States Patent
Lee et al.

(10) Patent No.: US 11,705,497 B2
(45) Date of Patent: Jul. 18, 2023

(54) SEMICONDUCTOR DEVICE

(71) Applicant: SAMSUNG ELECTRONICS CO., LTD., Suwon-si (KR)

(72) Inventors: In Yeal Lee, Seongnam-si (KR); Yoon Young Jung, Suwon-si (KR); Jin-Wook Kim, Hwaseong-si (KR); Deok Han Bae, Suwon-si (KR); Myung Yoon Um, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/185,466

(22) Filed: Feb. 25, 2021

(65) Prior Publication Data

US 2022/0013649 A1 Jan. 13, 2022

(30) Foreign Application Priority Data

Jul. 7, 2020 (KR) .................. 10-2020-0083295

(51) Int. Cl.
*H01L 29/423* (2006.01)
*H01L 29/786* (2006.01)
*H01L 29/06* (2006.01)
*H01L 29/51* (2006.01)

(52) U.S. Cl.
CPC .... *H01L 29/42392* (2013.01); *H01L 29/0673* (2013.01); *H01L 29/512* (2013.01); *H01L 29/78696* (2013.01)

(58) Field of Classification Search
CPC ........... H01L 29/42392; H01L 29/0673; H01L 29/512; H01L 29/78696; H01L 29/1079; H01L 29/0653; H01L 29/66439; H01L 29/775; H01L 27/088; H01L 29/0649; H01L 21/76832; H01L 21/02126; H01L 21/0217; H01L 21/28132; H01L 21/76834; B82Y 10/00
USPC .......................................................... 257/401
See application file for complete search history.

(56) References Cited

U.S. PATENT DOCUMENTS

| | | | |
|---|---|---|---|
| 9,034,703 B2 | 5/2015 | Cheng et al. | |
| 9,941,283 B2 | 4/2018 | Kim | |
| 10,249,726 B2 | 4/2019 | Xie et al. | |
| 10,522,537 B2 | 12/2019 | Kim et al. | |
| 10,586,855 B2 | 3/2020 | Cho et al. | |
| 10,593,779 B2 | 3/2020 | Basker et al. | |
| 2013/0270512 A1* | 10/2013 | Radosavljevic | H01L 29/775 438/212 |
| 2014/0231885 A1* | 8/2014 | Xie | H01L 29/6656 438/585 |

(Continued)

*Primary Examiner* — Tong-Ho Kim
(74) *Attorney, Agent, or Firm* — Sughrue Mion, PLLC

(57) ABSTRACT

A semiconductor device is provided. The semiconductor device includes a substrate, an active pattern extending in a first direction on the substrate, a gate electrode extending in a second direction intersecting the first direction on the active pattern, a gate spacer extending in the second direction along side walls of the gate electrode, an interlayer insulating layer contacting side walls of the gate spacer, a trench formed on the gate electrode in the interlayer insulating layer, a first capping pattern provided along side walls of the trench, at least one side wall of the first capping pattern having an inclined profile, and a second capping pattern provided on the first capping pattern in the trench.

22 Claims, 28 Drawing Sheets

(56) References Cited

U.S. PATENT DOCUMENTS

| | | | |
|---|---|---|---|
| 2014/0264486 A1* | 9/2014 | Pham | H01L 29/66545 |
| | | | 257/288 |
| 2015/0076624 A1 | 3/2015 | Liu et al. | |
| 2016/0308008 A1* | 10/2016 | Yeo | H01L 29/66545 |
| 2017/0179246 A1* | 6/2017 | Xie | H01L 21/31144 |
| 2019/0326416 A1 | 10/2019 | Huang et al. | |
| 2019/0348517 A1 | 11/2019 | Wang et al. | |

* cited by examiner

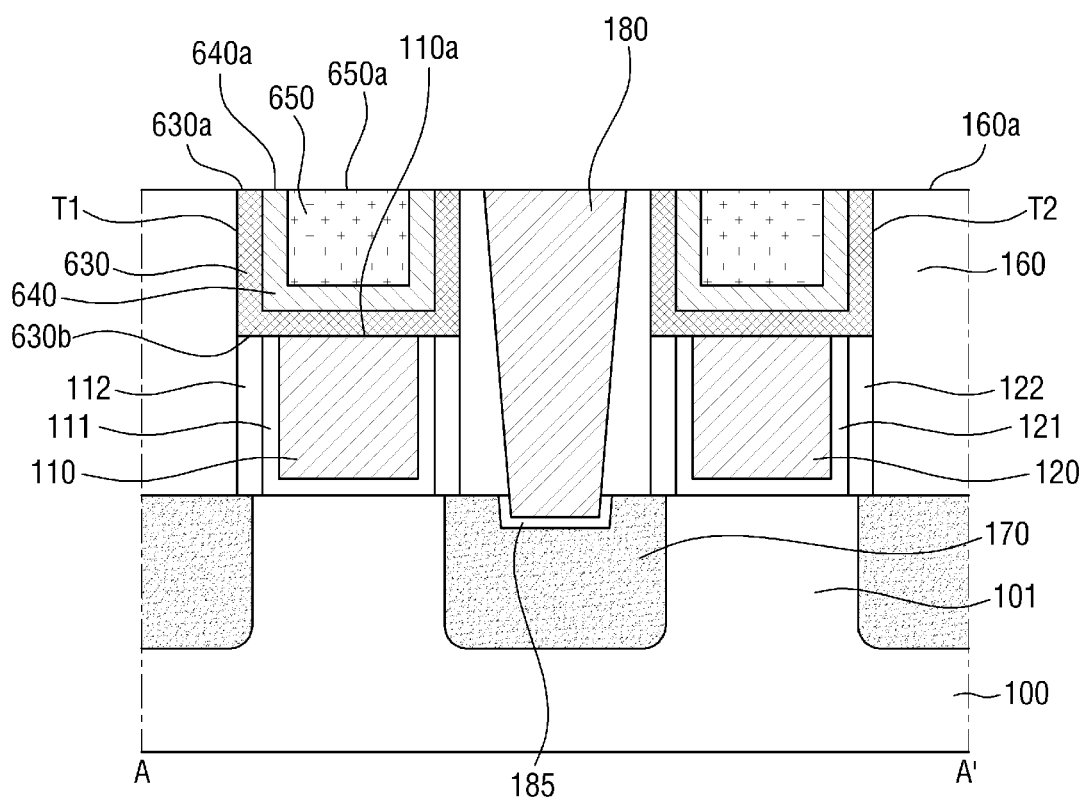
FIG. 8
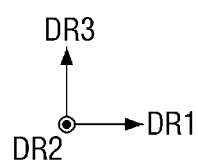

SEMICONDUCTOR DEVICE

This application claims priority to Korean Patent Application No. 10-2020-0083295, filed on Jul. 7, 2020, in the Korean Intellectual Property Office, the disclosure of which is incorporated by reference herein in its entirety.

BACKGROUND

1. Technical Field

Example embodiments of the present disclosure relate to a semiconductor device.

2. Description of the Related Art

Recently, with rapid spread of information media, functions of semiconductor devices also have been dramatically developed. In the case of recent semiconductor products, a low cost is required to secure competitiveness, and a high integration of product is required for high quality. For the high integration, semiconductor devices are being scaled down.

On the other hand, with a decrease in pitch size, research is required to obtain a capacitance decrease and to obtain electrical stability between contacts in a semiconductor device.

SUMMARY

One or more example embodiments provide a semiconductor device in which a capping pattern is formed in multi-layers and capacitance between a gate electrode and a source/drain contact can be effectively adjusted One or more example embodiments also provide a semiconductor device which is capable of efficiently guiding an etching process for forming a gate contact, by forming a first capping pattern having a line shape to have an inclined profile, and by filling a second capping pattern on the first capping pattern.

One or more example embodiments also provide a semiconductor device which is capable of efficiently guiding an etching process for forming a source/drain contact, by forming a capping pattern in multi-layers, and by placing a layer having relatively high etching resistance in an outermost part of the capping pattern.

According to an aspect of an example embodiment, there is provided a substrate; an active pattern extending in a first direction on the substrate; a gate electrode extending in a second direction on the active pattern, the second direction intersecting the first direction; a gate spacer extending in the second direction along side walls of the gate electrode; an interlayer insulating layer contacting side walls of the gate spacer; a trench formed on the gate electrode in the interlayer insulating layer; a first capping pattern provided along side walls of the trench, at least one side wall of the first capping pattern having an inclined profile; and a second capping pattern provided on the first capping pattern in the trench.

According to an aspect of an example embodiment, there is provided a substrate; an active pattern extending in a first direction on the substrate; a gate electrode extending in a second direction on the active pattern, the second intersecting the first direction; a gate spacer extending in the second direction along side walls of the gate electrode; an interlayer insulating layer contacting side walls of the gate spacer; a trench formed on the gate electrode in the interlayer insulating layer; a first capping pattern provided along walls of the trench, the first capping pattern including silicon oxycarbide (SiOC), and including carbon of a first atomic ratio; and a second capping pattern provided on the first capping pattern in the trench, the second capping pattern including silicon oxycarbide (SiOC), and including carbon of a second atomic ratio that is smaller than the first atomic ratio.

According to an aspect of the example embodiment, there is provided a substrate; an active pattern extending in a first direction on the substrate; a gate electrode extending in a second direction on the active pattern, the second direction intersecting the first direction; a gate spacer extending in the second direction along side walls of the gate electrode; an interlayer insulating layer contacting side walls of the gate spacer; a trench formed on the gate electrode in the interlayer insulating layer; a first capping pattern provided along side walls of the trench, the first capping pattern comprises a first side wall and a second side wall opposite to the first side wall, the first side wall has an inclined profile, the second side wall contacting the interlayer insulating layer, and the first capping pattern including silicon oxycarbide (SiOC); a second capping pattern provided on the first capping pattern in the trench, the second capping pattern contacting the first side wall of the first capping pattern, the second capping pattern including a material different from a material of the first capping pattern; a source/drain region provided on at least one of side of the gate electrode; and a source/drain contact penetrating the interlayer insulating layer in a third direction that is perpendicular to the first direction and the second direction, the source/drain contact being connected to the source/drain region.

However, aspects of the present disclosure are not restricted to the those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof with reference to the attached drawings, in which:

FIG. 8 is a cross-sectional view for explaining a semiconductor device according to an example embodiment;

DETAILED DESCRIPTION OF THE EMBODIMENTS

Semiconductor device according to example embodiments of the present disclosure will be explained below with reference to FIGS. 1 to 3.

Figure 1:
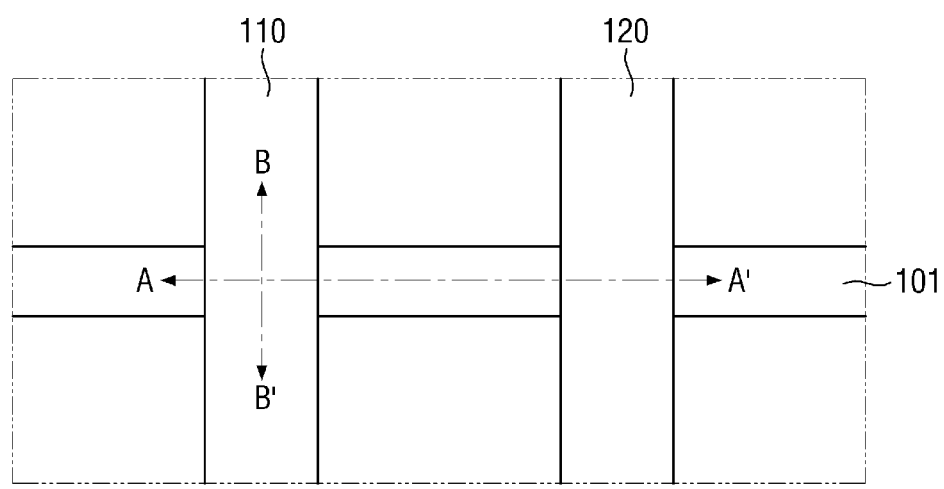
FIG. 1 is a schematic plan view for explaining a semiconductor device according to an example embodiment.
Figure 1:
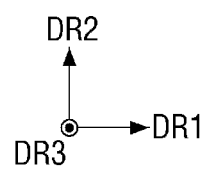

FIG. 1 is a schematic plan view for explaining a semiconductor device according to an example embodiment. FIG. 2 is a cross-sectional view taken along a line A-A' of FIG. 1. FIG. 3 is a cross-sectional view taken along a line B-B' of FIG. 1.

Figure 2:
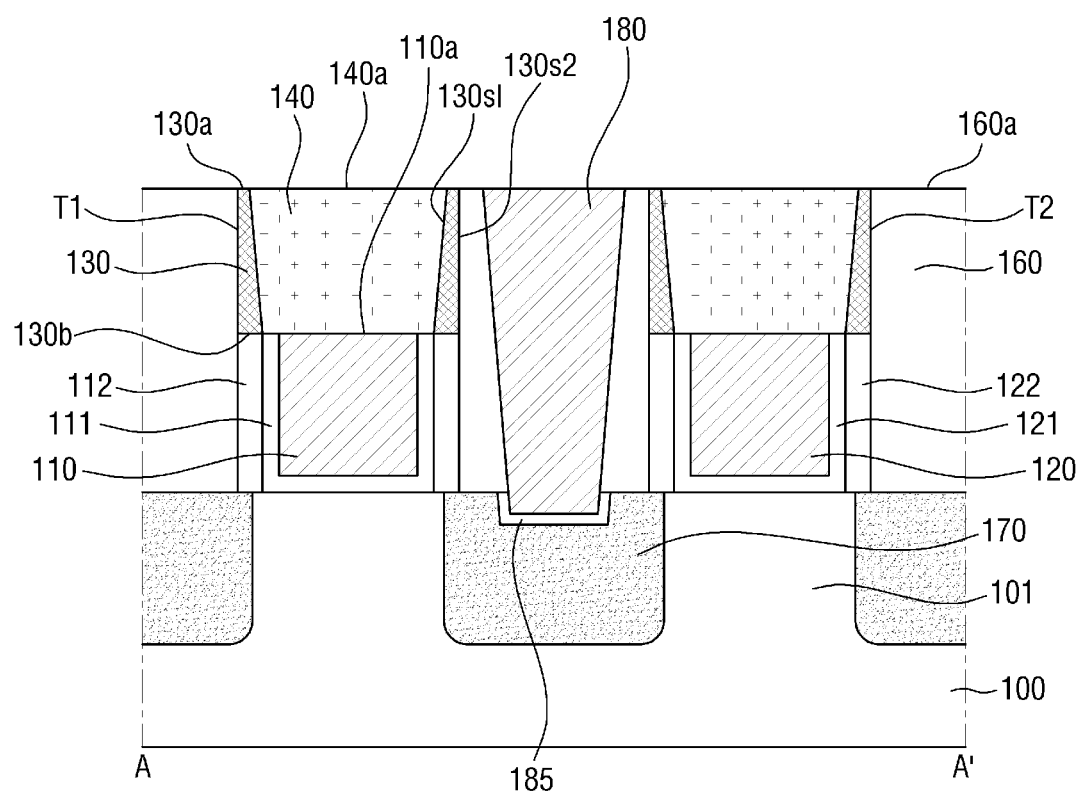
FIG. 2 is a cross-sectional view taken along a line A-A' of FIG. 1.
Figure 2:
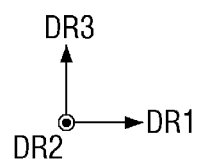
Figure 3:
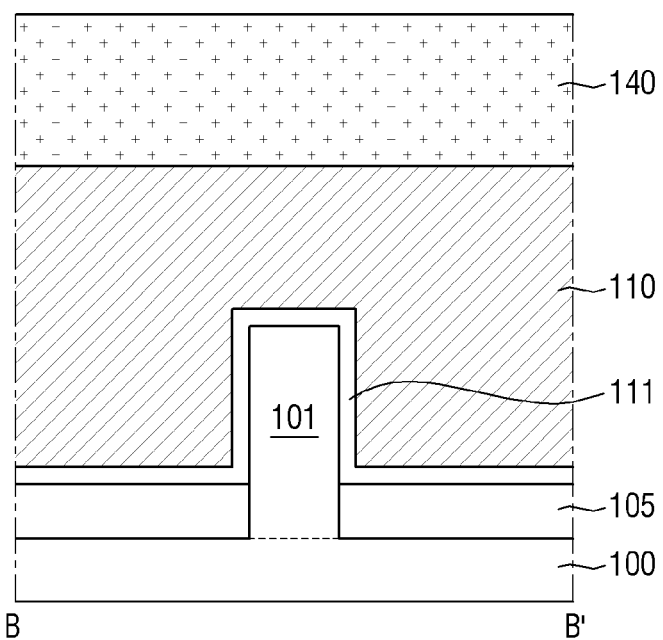
FIG. 3 is a cross-sectional view taken along the line B-B' of FIG. 1.
Figure 3:
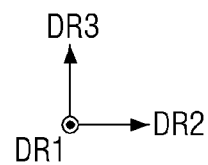

Referring to FIGS. 1, 2, and 3, the semiconductor device according to an example embodiment comprises a substrate 100, an active pattern 101, a field insulating layer 105, a first gate electrode 110, a first gate insulating film 111, a first gate spacer 112, a second gate electrode 120, a second gate insulating film 121, a second gate spacer 122, a first capping pattern 130, a second capping pattern 140, an interlayer insulating layer 160, a source/drain region 170, a source/drain contact 180, and a silicide film 185.

Embodiments may adjust capacitance between the gate electrodes 110 and 120 and the source/drain contact 180. The capacitance is configured based on the capping patterns 130 and 140. Decreased pitch of semiconductor features can lead to problematic capacitance between gate electrodes and source/drain contacts. Embodiments may adjust capacitance using multi-layer capping, with capping materials of various dielectric properties. Capacitance depends on geometry (spacing) and dielectric properties of materials between metal contacts. Embodiments may adjust capacitance by adjusting geometry and by adjusting dielectric properties of materials between metal contacts. In some embodiments, the geometry includes inclined surfaces and/or chamfering. In some embodiments, the dielectric properties are adjusted based on atomic ratios.

The substrate 100 may be bulk silicon or SOI (silicon-on-insulator). Alternatively, the substrate 100 may be a silicon substrate or may include other materials, for example, germanium, silicon germanium, indium antimonide, lead tellurium compounds, indium arsenide, indium phosphide, gallium arsenide or gallium antimonide. However, the embodiments are not limited thereto.

The active pattern 101 may extend in a first direction DR1 on the substrate 100. The active pattern 101 may be disposed to protrude from the substrate 100. The active pattern 101 may be a part of the substrate 100, and may comprise an epitaxial layer grown from the substrate 100. The active pattern 101 may be defined by the field insulating layer 105.

The active pattern 101 may be, for example, a region in which an NMOS is formed. However, embodiments are not limited thereto. In some other embodiments, the active pattern 101 may be a region in which a PMOS is formed.

The field insulating layer 105 may be disposed on the substrate 100. The field insulating layer 105 may be disposed on side walls of the active pattern 101. The active pattern 101 may protrude upward from an upper surface of the field insulating layer 105. The field insulating layer 105 may include, for example, an oxide film, a nitride film, an oxynitride film or a combination thereof.

Each of the first gate electrode 110 and the second gate electrode 120 may be disposed on the active pattern 101 and the field insulating layer 105. Each of the first gate electrode 110 and the second gate electrode 120 may extend in a second direction DR2 that intersects the first direction DR1. The second gate electrode 120 may be spaced apart from the first gate electrode 110 in the first direction DR1.

The first gate insulating film 111 may be disposed along side walls and a bottom surface of the first gate electrode 110. The second gate insulating film 121 may be disposed along the side walls and a bottom surface of the second gate electrode 120.

Each of the first gate insulating film 111 and the second gate insulating film 121 may be disposed along a profile of the active pattern 101 protruding upward from the field insulating layer 105 and the upper surface of the field insulating layer 105. An interface film may be further disposed from the along the profile of the active pattern 101 protruding upward from the field insulating layer 105. In this case, each of the first gate insulating film 111 and the second gate insulating film 121 may be disposed on the interface film.

Each of the first gate insulating film 111 and the second gate insulating film 121 may include silicon oxide, silicon oxynitride, silicon nitride, or a high dielectric constant material having a higher dielectric constant than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The first gate spacer 112 may extend in the second direction DR2 along both side walls of the first gate electrode 110. The first gate insulating film 111 may be disposed between the first gate electrode 110 and the first gate spacer 112. The second gate spacer 122 may extend in the second direction DR2 along both side walls of the second gate electrode 120. A second gate insulating film 121 may be disposed between the second gate electrode 120 and the second gate spacer 122.

An upper surface of the first gate spacer 112 may be formed on the same plane as the upper surface 110a of the first gate electrode 110. Similarly, an upper surface of the second gate spacer 122 may be formed on the same plane as the upper surface of the second gate electrode 120.

Each of the first gate spacer 112 and the second gate spacer 122 may include, for example, at least one of silicon nitride (SiN), silicon oxynitride (SiON), silicon oxide (SiO$_2$), silicon oxycarbo nitride (SiOCN), silicon boron nitride (SiBN), silicon boron oxynitride (SiOBN), silicon oxycarbide (SiOC), and combinations thereof.

The interlayer insulating layer 160 may be disposed on the field insulating layer 105. The interlayer insulating layer 160 may be in contact with each of the side walls of the first gate spacer 112, the side walls of the second gate spacer 122, and the side walls of the first capping pattern 130.

The interlayer insulating layer 160 may include at least one of silicon oxide, silicon nitride, silicon oxynitride and a low dielectric constant material. The low dielectric constant material may include, for example, Fluorinated TetraEthylOrthoSilicate (FTEOS), Hydrogen SilsesQuioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica, or a combination thereof. However, embodiments are not limited thereto.

A first trench T1 may be formed on the first gate electrode 110, the first gate insulating film 111 and the first gate spacer 112 in the interlayer insulating layer 160. The profile of the side walls of the first trench T1 may be continuously formed with the profile of the side walls of the first gate spacer 112.

A second trench T2 may be formed on the second gate electrode 120, the second gate insulating film 121 and the second gate spacer 122 in the interlayer insulating layer 160. A profile of the side walls of the second trench T2 may be formed continuously with a profile of the side walls of the second gate spacer 122.

The first capping pattern 130 may be disposed in each of the first trench T1 and the second trench T2. The first capping pattern 130 may be disposed along the side walls of the first trench T1 and the side walls of the second trench T2.

The first capping pattern 130 may comprise a first side wall 130s1, and a second side wall 130s2 opposite to the first side wall 130s1. The first side wall 130s1 of the first capping pattern 130 may be in contact with the second capping pattern 140. The second side wall 130s2 of the first capping pattern 130 may be in contact with the interlayer insulating layer 160.

At least one side wall of the first capping pattern 130 may have an inclined profile. For example, the first side wall 130s1 of the first capping pattern 130 may have an inclined profile. That is, a width of the first capping pattern 130 in the first direction DR1 decrease as it goes away from the substrate 100.

An upper surface 130a of the first capping pattern 130 may be formed on the same plane as an upper surface 160a of the interlayer insulating layer 160. A lower surface 130b of the first capping pattern 130 may be in contact with each of the upper surface of the first gate spacer 112 and the upper surface of the second gate spacer 122. Although FIG. 2 shows that the first capping pattern 130 is not in contact with each of the first gate insulating film 111 and the second gate insulating film 121, embodiments are not limited thereto. In some other embodiments, the first capping pattern 130 may be in contact with each of the first gate insulating film 111 and the second gate insulating film 121. Also, in some other embodiments, the first capping pattern 130 may be in contact with each of the first gate electrode 110 and the second gate electrode 120.

The first capping pattern 130 may include, for example, silicon oxycarbide (SiOC). In some other embodiments, the first capping pattern 130 may include, for example, at least one of silicon oxide (SiO$_2$), silicon oxycarbo nitride (SiOCN), silicon nitride (SiN), boron carbonitride (BCN), silicon boron oxycarbide (SiBOC), silicon boron oxynitride (SiBCN), and combinations thereof. The first capping pattern 130 may include, for example, a material different from each of the first gate spacer 112 and the second gate spacer 122.

The first capping pattern 130 may include carbon of a first atomic ratio. The first atomic ratio may be, for example, 18% to 24%. Here, the atomic ratio means a percentage of the number of atoms to the total number of atoms. This percentage may also be referred to generally as atomic percent.

The second capping pattern 140 may be disposed on the first capping pattern 130 in each of the first trench T1 and the second trench T2. That is, the second capping pattern 140 may be disposed between the first capping patterns 130 in each of the first trench T1 and the second trench T2. The second capping pattern 140 may completely fill the remaining portions in each of the first trench T1 and the second trench T2.

An upper surface 140a of the second capping pattern 140 may be formed on the same plane as the upper surface 130a of the first capping pattern 130. The upper surface 140a of the second capping pattern 140 may be formed on the same plane as the upper surface 160a of the interlayer insulating layer 160. The second capping pattern 140 may be in contact with each of the first gate electrode 110 and the second gate electrode 120.

The second capping pattern 140 may include a material different from the first capping pattern 130. The second capping pattern 140 may include, for example, silicon nitride (SiN). That is, the first capping pattern 130 may include silicon oxycarbide (SiOC), and the second capping pattern 140 may include silicon nitride (SiN). In some other embodiments, the second capping pattern 140 may include, for example, at least one of silicon nitride (SiN), silicon oxynitride (SiON), silicon oxide (SiO$_2$), silicon carbonitride (SiCN), silicon oxycarbo nitride (SiOCN) and combinations thereof.

The source/drain region 170 may be disposed on at least one side of the first gate electrode 110. Also, the source/drain region 170 may be disposed on at least one side of the second gate electrode 120. For convenience of explanation, FIG. 2 shows that the source/drain regions 170 are disposed on both sides of each of the first gate electrode 110 and the second gate electrode 120.

The source/drain contact 180 may be disposed, for example, between the first gate electrode 110 and the second gate electrode 120. The source/drain contact 180 may penetrate the interlayer insulating layer 160 in a third direction DR3 perpendicular to the first and second directions DR1 and DR2. The source/drain contact 180 may extend into the source/drain region 170 and be brought into contact with the source/drain region 170. The source/drain contact 180 may include a conductive material.

The silicide film 185 may be disposed between the source/drain region 170 and the source/drain contact 180. Although the silicide film 185 is shown as being formed along a profile of an interface between the source/drain region 170 and the source/drain contact 180, embodiments are not limited thereto. The silicide film 185 may include, for example, a metal silicide material.

A semiconductor device according to an example embodiment may effectively adjust capacitance between the gate electrodes 110 and 120 and the source/drain contact 180, by forming the capping patterns 130 and 140 into multi-layers.

Also, the semiconductor device according to an example embodiment can efficiently guide the etching process for forming the gate contact, by forming the first capping pattern 130 having a line shape to have an inclined profile, and by filling the second capping pattern 140 on the first capping pattern 130.

Hereinafter, a semiconductor device according to some other embodiments of the present disclosure will be explained with reference to FIG. 4. Differences from the semiconductor device shown in FIGS. 1 to 3 will be mainly explained.

Figure 4:
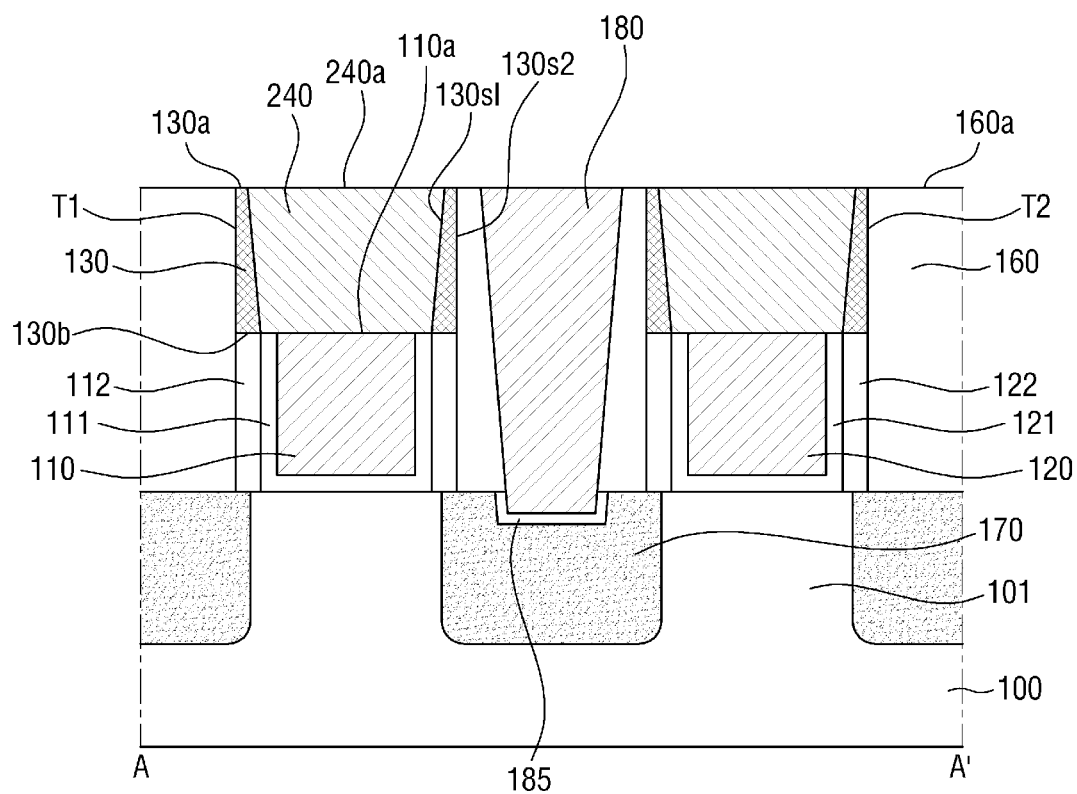
FIG. 4 is a cross-sectional view for explaining a semiconductor device according to an example embodiment.
Figure 4:
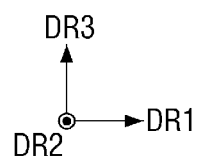

FIG. 4 is a cross-sectional view for explaining a semiconductor device according to some other embodiments of the present disclosure.

Referring to FIG. 4, in the semiconductor device according to some other embodiments of the present disclosure, the second capping pattern 240 may include silicon oxycarbide (SiOC).

The second capping pattern 240 may include carbon of a second atomic ratio. The second atomic ratio may be, for example, 12% to 18%. The second atomic ratio may be smaller than the first atomic ratio. That is, the second atomic ratio of carbon contained in the second capping pattern 240 may be smaller than the first atomic ratio of carbon contained in the first capping pattern 130.

An upper surface 240a of the second capping pattern 240 may be formed on the same plane as the upper surface 130a of the first capping pattern 130. The upper surface 240a of the second capping pattern 240 may be formed on the same plane as the upper surface 160a of the interlayer insulating layer 160.

Hereinafter, a semiconductor device according to some other embodiments of the present disclosure will be explained with reference to FIG. 5. Differences from the semiconductor device shown in FIGS. 1 to 3 will be mainly explained.

Figure 5:
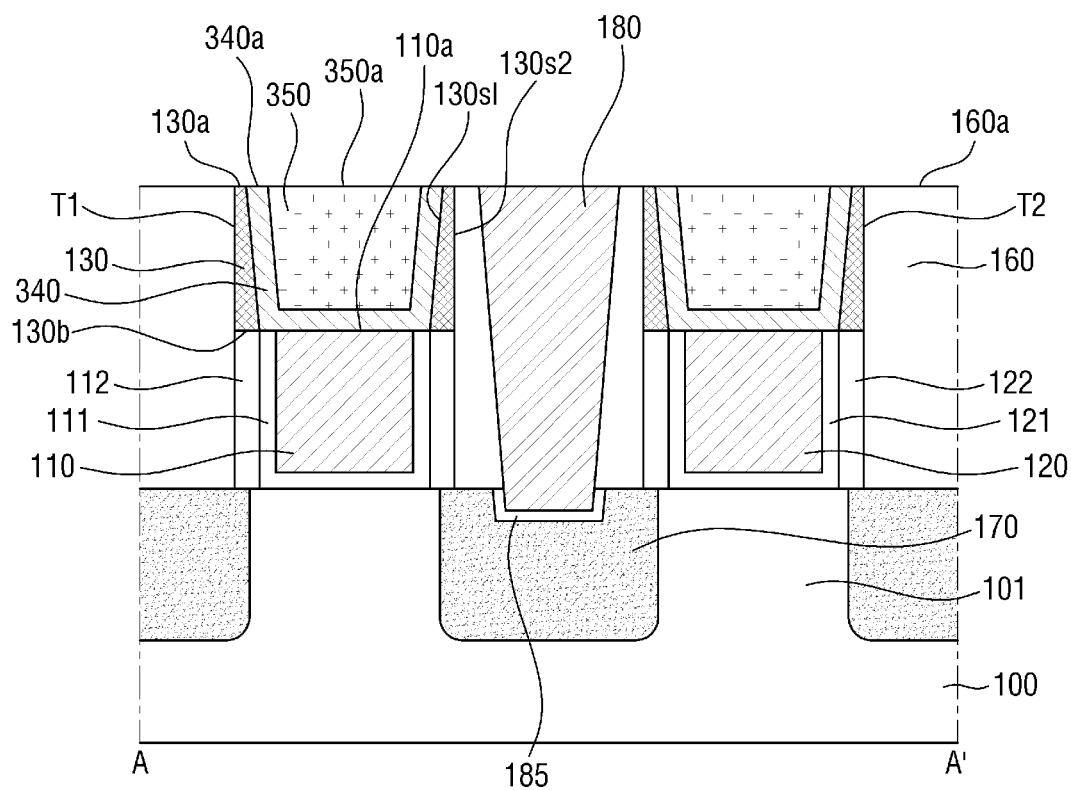
FIG. 5 is a cross-sectional view for explaining a semiconductor device according to an example embodiment.
Figure 5:
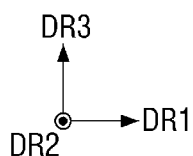

FIG. 5 is a cross-sectional view for explaining a semiconductor device according to some other embodiments of the present disclosure.

Referring to FIG. 5, in the semiconductor device according to some other embodiments of the present disclosure, a second capping pattern 340 and a third capping pattern 350 may be disposed on each of the first gate electrode 110 and the second gate electrode 120.

The second capping pattern 340 may be disposed in the first trench T1 along the first side wall 130s1 of the first capping pattern 130 and the upper surface 110a of the first gate electrode 110. Also, the second capping pattern 340 may be disposed in the second trench T2 along the first side wall 130s1 of the first capping pattern 130 and the upper surface of the second gate electrode 120. The second capping pattern 340 may be, for example, conformally disposed. However, embodiments are not limited thereto.

The second capping pattern 340 may include silicon oxycarbide (SiOC). The second capping pattern 340 may include carbon of a second atomic ratio. The second atomic ratio may be, for example, 12% to 18%. The second atomic ratio may be smaller than the first atomic ratio. That is, the second atomic ratio of carbon contained in the second capping pattern 340 may be smaller than the first atomic ratio of carbon contained in the first capping pattern 130.

The third capping pattern 350 may be disposed on the second capping pattern 340 in each of the first trench T1 and the second trench T2. The third capping pattern 350 may completely fill the remaining portions in each of the first trench T1 and the second trench T2.

The third capping pattern 350 may include a material different from the first capping pattern 130 and the second capping pattern 340. The third capping pattern 350 may include, for example, silicon nitride (SiN). That is, each of the first capping pattern 130 and the second capping pattern 340 may include silicon oxycarbide (SiOC), and the third capping pattern 350 may include silicon nitride (SiN).

An upper surface 130a of the first capping pattern 130, an upper surface 340a of the second capping pattern 340, an upper surface 350a of the third capping pattern 350 and an upper surface 160a of the interlayer insulating layer 160 may be formed on the same plane.

Hereinafter, a semiconductor device according to some other embodiments of the present disclosure will be explained with reference to FIG. 6. Differences from the semiconductor device shown in FIGS. 1 to 3 will be mainly explained.

Figure 6:
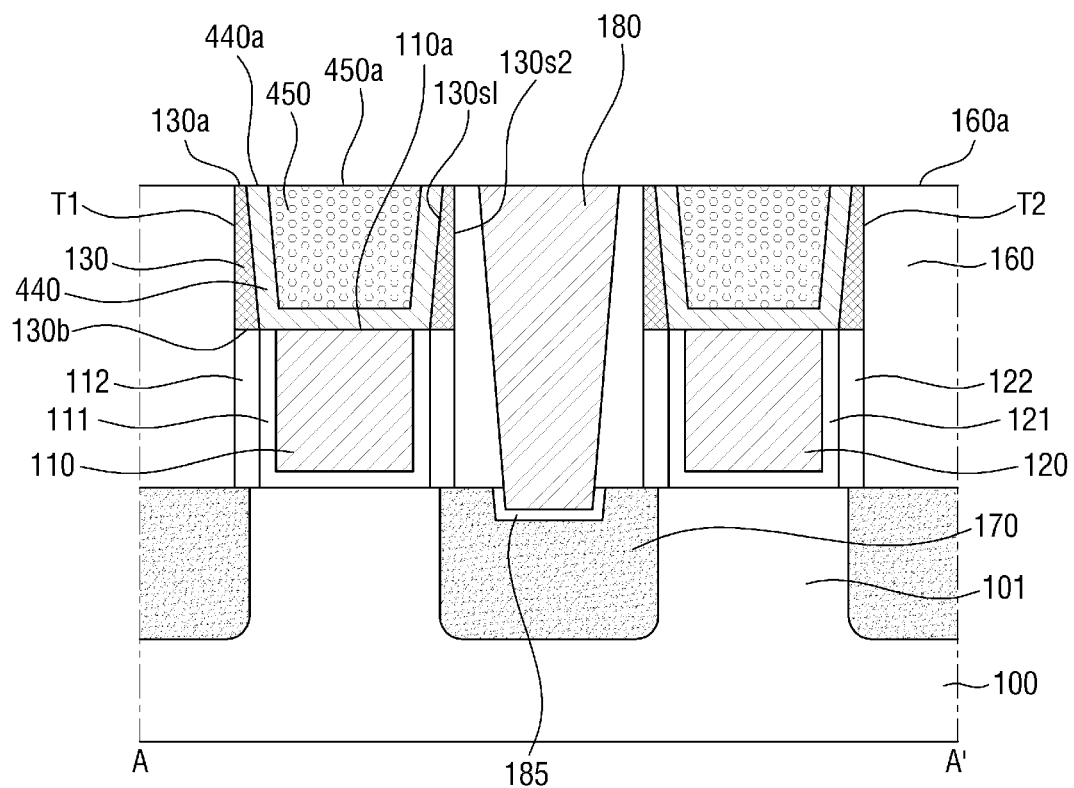
FIG. 6 is a cross-sectional view for explaining a semiconductor device according to an example embodiment.
Figure 6:
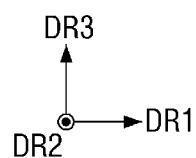

FIG. 6 is a cross-sectional view for explaining a semiconductor device according to some other embodiments of the present disclosure.

Referring to FIG. 6, in the semiconductor device according to some other embodiments of the present disclosure, a second capping pattern 440 and a third capping pattern 450 may be disposed on each of the first gate electrode 110 and the second gate electrode 120.

The second capping pattern 440 may be disposed in the first trench T1 along the first side wall 130s1 of the first capping pattern 130 and the upper surface 110a of the first gate electrode 110. Also, the second capping pattern 440 may be disposed in the second trench T2 along the first side wall 130s1 of the first capping pattern 130 and the upper surface of the second gate electrode 120. The second capping pattern 440 may be, for example, conformally disposed. However, embodiments are not limited thereto.

The second capping pattern 440 may include silicon oxycarbide (SiOC). The second capping pattern 440 may include carbon of a second atomic ratio. The second atomic ratio may be, for example, 12% to 18%. The second atomic ratio may be smaller than the first atomic ratio. That is, the second atomic ratio of carbon contained in the second capping pattern 440 may be smaller than the first atomic ratio of carbon contained in the first capping pattern 130.

The third capping pattern 450 may be disposed on the second capping pattern 440 in each of the first trench T1 and the second trench T2. The third capping pattern 450 may completely fill the remaining portions in each of the first trench T1 and the second trench T2.

The third capping pattern 450 may include silicon oxycarbide (SiOC). The third capping pattern 450 may include carbon of a third atomic ratio. The third atomic ratio may be, for example, 6% to 12%. The third atomic ratio may be smaller than the second atomic ratio. That is, the third atomic ratio of carbon contained in the third capping pattern 450 may be smaller than the second atomic ratio of carbon contained in the second capping pattern 440.

An upper surface 130a of the first capping pattern 130, an upper surface 440a of the second capping pattern 440, an upper surface 450a of the third capping pattern 450 and an upper surface 160a of the interlayer insulating layer 160 may be formed on the same plane.

Hereinafter, a semiconductor device according to some other embodiments of the present disclosure will be explained with reference to FIG. 7. Differences from the semiconductor device shown in FIGS. 1 to 3 will be mainly explained.

Figure 7:
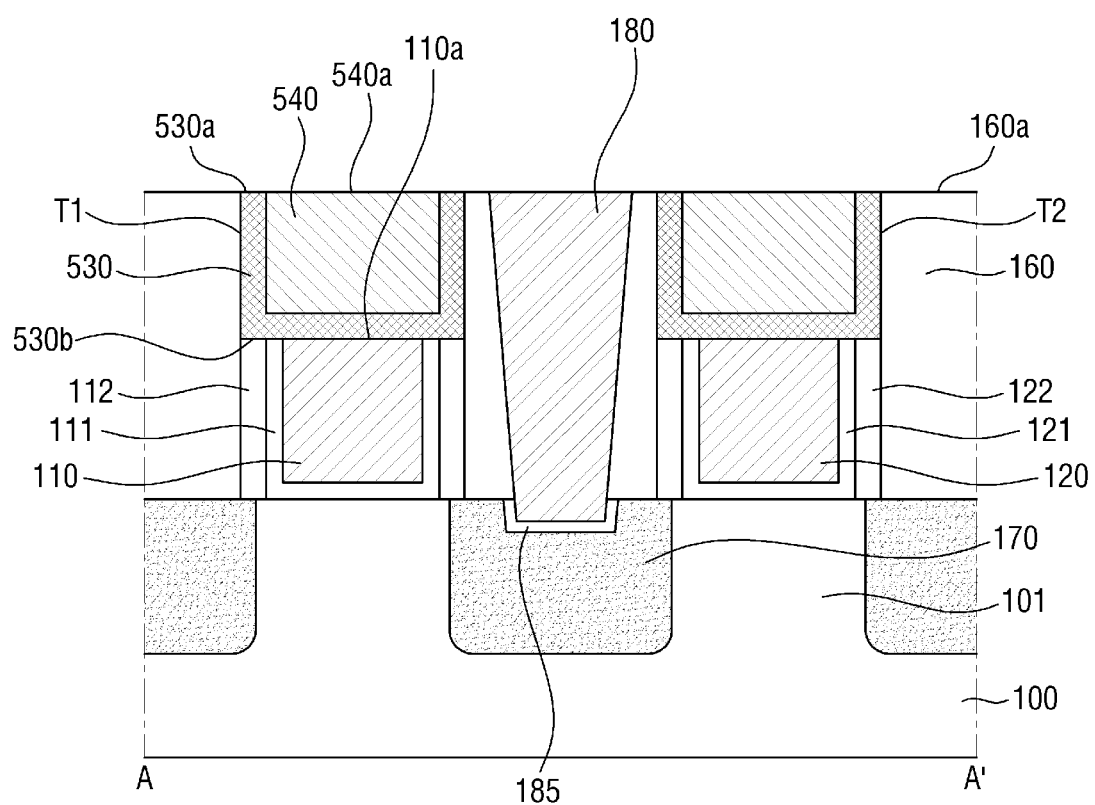
FIG. 7 is a cross-sectional view for explaining a semiconductor device according to an example embodiment.
Figure 7:
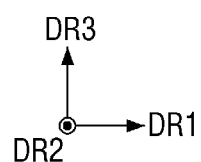

FIG. 7 is a cross-sectional view for explaining a semiconductor device according to some other embodiments of the present disclosure.

Referring to FIG. 7, in the semiconductor device according to some other embodiments of the present disclosure, a first capping pattern 530 may be disposed along side walls and a bottom surface of the first trench T1. A lower surface 530b of the first capping pattern 530 may be in contact with each of the first gate electrode 110, the first gate insulating film 111 and the first gate spacer 112. Also, the first capping pattern 530 may be disposed along the side walls and bottom surface of the second trench T2. The lower surface of the first capping pattern 530 may be in contact with each of the second gate electrode 120, the second gate insulating film 121 and the second gate spacer 122.

The side walls of the first capping pattern 530 do not have an inclined profile. The first capping pattern 530 may be, for example, conformally disposed. However, embodiments are not limited thereto.

The first capping pattern 530 may include silicon oxycarbide (SiOC). The first capping pattern 530 may include carbon of a first atomic ratio. The first atomic ratio may be, for example, 18% to 24%.

The second capping pattern 540 may be disposed on the first capping pattern 530 in each of the first trench T1 and the second trench T2. The second capping pattern 540 may completely fill the remaining portions in each of the first trench T1 and the second trench T2.

The second capping pattern 540 may include silicon oxycarbide (SiOC). The second capping pattern 540 may include carbon of a second atomic ratio. The second atomic ratio may be, for example, 12% to 18%. The second atomic ratio may be smaller than the first atomic ratio. That is, the second atomic ratio of carbon contained in the second capping pattern 540 may be smaller than the first atomic ratio of carbon contained in the first capping pattern 530.

An upper surface 530a of the first capping pattern 530, an upper surface 540a of the second capping pattern 540 and an upper surface 160a of the interlayer insulating layer 160 may be formed on the same plane.

A semiconductor device according to some other embodiments of the present disclosure will be explained below with reference to FIG. 8. Differences from the semiconductor device shown in FIGS. 1 to 3 will be mainly explained.

FIG. 8 is a cross-sectional view for explaining a semiconductor device according to some other embodiments of the present disclosure.

Referring to FIG. 8, in the semiconductor device according to an example embodiment, a first capping pattern 630 may be disposed along side walls and the bottom surface of the first trench T1. A lower surface 630b of the first capping pattern 630 may be in contact with each of the first gate electrode 110, the first gate insulating film 111 and the first gate spacer 112. Also, the first capping pattern 630 may be disposed along the side walls and bottom surface of the second trench T2. The lower surface of the first capping pattern 630 may be in contact with each of the second gate electrode 120, the second gate insulating film 121 and the second gate spacer 122.

The side walls of the first capping pattern 630 do not have an inclined profile. The first capping pattern 630 may be, for example, conformally disposed. However, embodiments are not limited thereto.

The first capping pattern 630 may include silicon oxycarbide (SiOC). The first capping pattern 630 may include carbon of a first atomic ratio. The first atomic ratio may be, for example, 18% to 24%.

A second capping pattern 640 may be disposed on the first capping pattern 630 in each of the first trench T1 and the second trench T2. The second capping pattern 640 may be, for example, conformally disposed. However, embodiments are not limited thereto.

The second capping pattern 640 may include silicon oxycarbide (SiOC). The second capping pattern 640 may include carbon of a second atomic ratio. The second atomic ratio may be, for example, 12% to 18%. The second atomic ratio may be smaller than the first atomic ratio. That is, the second atomic ratio of carbon contained in the second capping pattern 640 may be smaller than the first atomic ratio of carbon contained in the first capping pattern 630.

A third capping pattern 650 may be disposed on the second capping pattern 640 in each of the first trench T1 and the second trench T2. The third capping pattern 650 may completely fill the remaining portions in each of the first trench T1 and the second trench T2.

The third capping pattern 650 may include a material different from the first capping pattern 630 and the second capping pattern 640. The third capping pattern 650 may include, for example, silicon nitride (SiN). That is, each of the first capping pattern 630 and the second capping pattern 640 may include silicon oxycarbide (SiOC), and the third capping pattern 650 may include silicon nitride (SiN).

An upper surface 630a of the first capping pattern 630, an upper surface 640a of the second capping pattern 640, an upper surface 650a of the third capping pattern 650 and an upper surface 160a of the interlayer insulating layer 160 may be formed on the same plane.

A semiconductor device according to some other embodiments of the present disclosure will be explained below with reference to FIG. 9. Differences from the semiconductor device shown in FIGS. 1 to 3 will be mainly explained.

Figure 9:
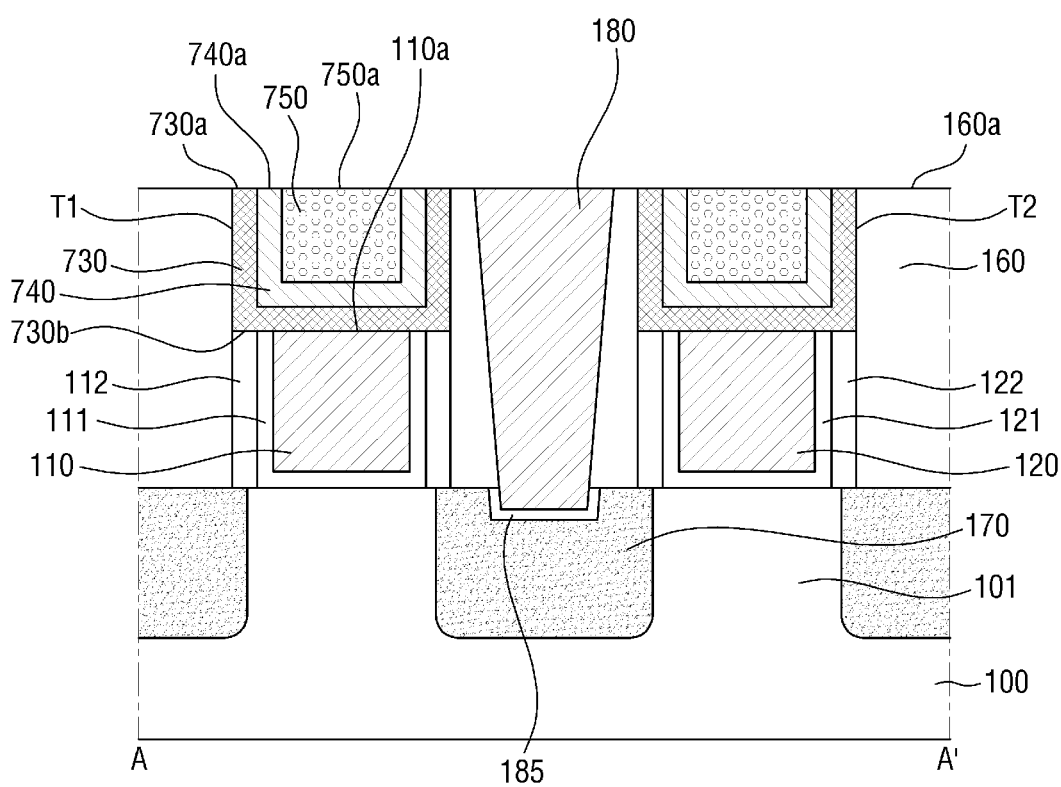
FIG. 9 is a cross-sectional view for explaining a semiconductor device according to an example embodiment.
Figure 9:
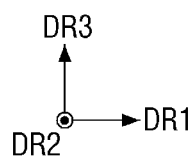

FIG. 9 is a cross-sectional view for explaining a semiconductor device according to some other embodiments of the present disclosure.

Referring to FIG. 9, in the semiconductor device according to some other embodiments of the present disclosure, a first capping pattern 730 may be disposed along side walls and the bottom surface of the first trench T1. A lower surface 730b of the first capping pattern 730 may be in contact with each of the first gate electrode 110, the first gate insulating film 111 and the first gate spacer 112. Also, the first capping pattern 730 may be disposed along the side walls and bottom surface of the second trench T2. The lower surface of the first capping pattern 730 may be in contact with each of the second gate electrode 120, the second gate insulating film 121 and the second gate spacer 122.

The side walls of the first capping pattern 730 do not have an inclined profile. The first capping pattern 730 may be, for example, conformally disposed. However, embodiments are not limited thereto.

The first capping pattern 730 may include silicon oxycarbide (SiOC). The first capping pattern 730 may include carbon of a first atomic ratio. The first atomic ratio may be, for example, 18% to 24%.

A second capping pattern 740 may be disposed on the first capping pattern 730 in each of the first trench T1 and the second trench T2. The second capping pattern 740 may be, for example, conformally disposed. However, embodiments are not limited thereto.

The second capping pattern 740 may include silicon oxycarbide (SiOC). The second capping pattern 740 may include carbon of a second atomic ratio. The second atomic ratio may be, for example, 12% to 18%. The second atomic ratio may be smaller than the first atomic ratio. That is, the second atomic ratio of carbon contained in the second capping pattern 740 may be smaller than the first atomic ratio of carbon contained in the first capping pattern 730.

A third capping pattern 750 may be disposed on the second capping pattern 740 in each of the first trench T1 and the second trench T2. The third capping pattern 750 may completely fill the remaining portions in each of the first trench T1 and the second trench T2.

The third capping pattern 750 may include silicon oxycarbide (SiOC). The third capping pattern 750 may include carbon of a third atomic ratio. The third atomic ratio may be, for example, 6% to 12%. The third atomic ratio may be smaller than the second atomic ratio. That is, the third atomic ratio of carbon contained in the third capping pattern 750 may be smaller than the second atomic ratio of carbon contained in the second capping pattern 740.

An upper surface 730a of the first capping pattern 730, an upper surface 740a of the second capping pattern 740, an upper surface 750a of the third capping pattern 750 and an upper surface 160a of the interlayer insulating layer 160 may be formed on the same plane.

Hereinafter, a semiconductor device according to some other embodiments of the present disclosure will be explained with reference to FIG. 10. Differences from the semiconductor device shown in FIGS. 1 to 3 will be mainly explained.

Figure 10:
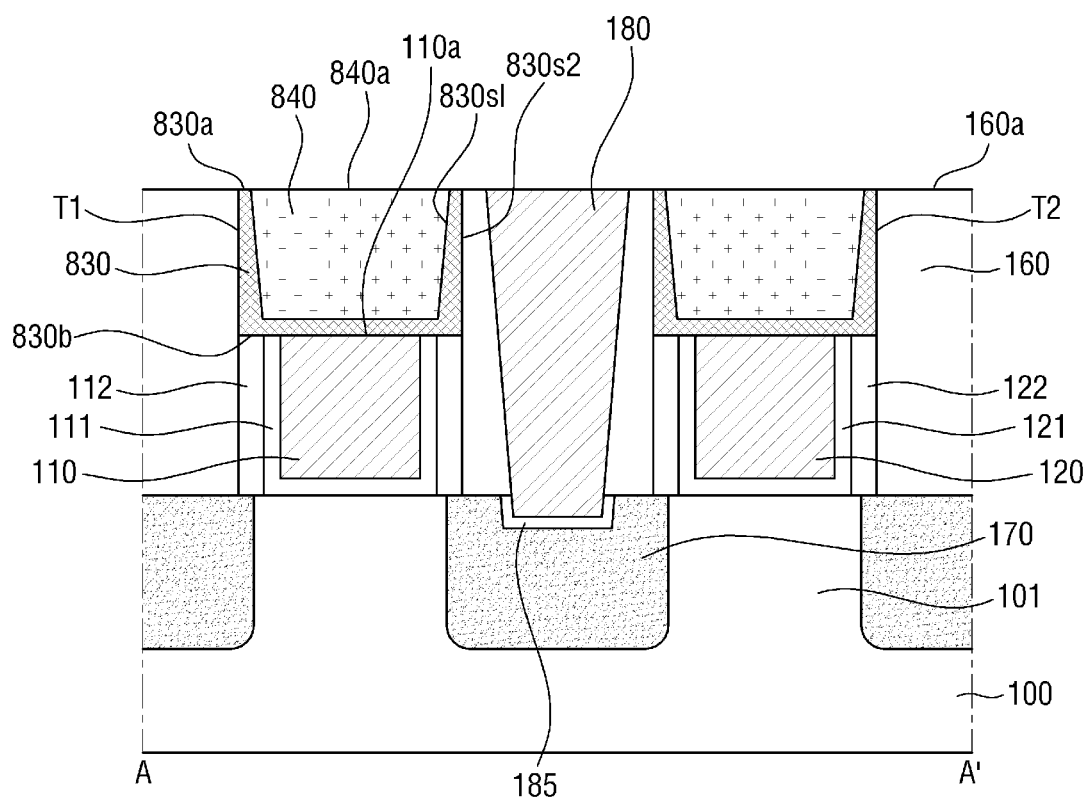
FIG. 10 is a cross-sectional view for explaining a semiconductor device according to an example embodiment.
Figure 10:
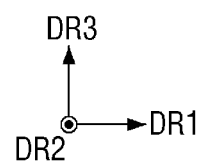

FIG. 10 is a cross-sectional view for explaining a semiconductor device according to some other embodiments of the present disclosure.

Referring to FIG. 10, in the semiconductor device according to an example embodiment, a first capping pattern 830 may be disposed to cover each of the upper surface 110a of the first gate electrode 110 and the upper surface of the second gate electrode 120. A lower surface 830b of the first capping pattern 830 may be in contact with each of the first gate electrode 110, the first gate insulating film 111 and the first gate spacer 112. Also, the lower surface 830b of the first capping pattern 830 may be in contact with each of the second gate electrode 120, the second gate insulating film 121, and the second gate spacer 122.

The first capping pattern 830 may comprise a first side wall 830s1 being in contact with the second capping pattern 840 and having an inclined profile, and a second side wall 830s2 being in contact with the interlayer insulating layer 160.

A second capping pattern 840 may be disposed on the first capping pattern 830 in each of the first trench T1 and the second trench T2. The second capping pattern 840 may completely fill the remaining portions in each of the first trench T1 and the second trench T2.

The second capping pattern 840 may include a material different from the first capping pattern 830. The second capping pattern 840 may include, for example, silicon nitride (SiN). That is, the first capping pattern 830 may include silicon oxycarbide (SiOC), and the second capping pattern 840 may include silicon nitride (SiN).

Each of an upper surface 830a of the first capping pattern 830, an upper surface 840a of the second capping pattern 840, and an upper surface 160a of the interlayer insulating layer 160 may be formed on the same plane.

Hereinafter, a semiconductor device according to some other embodiments of the present disclosure will be explained with reference to FIG. 11. Differences from the semiconductor device shown in FIGS. 1 to 3 will be mainly explained.

Figure 11:
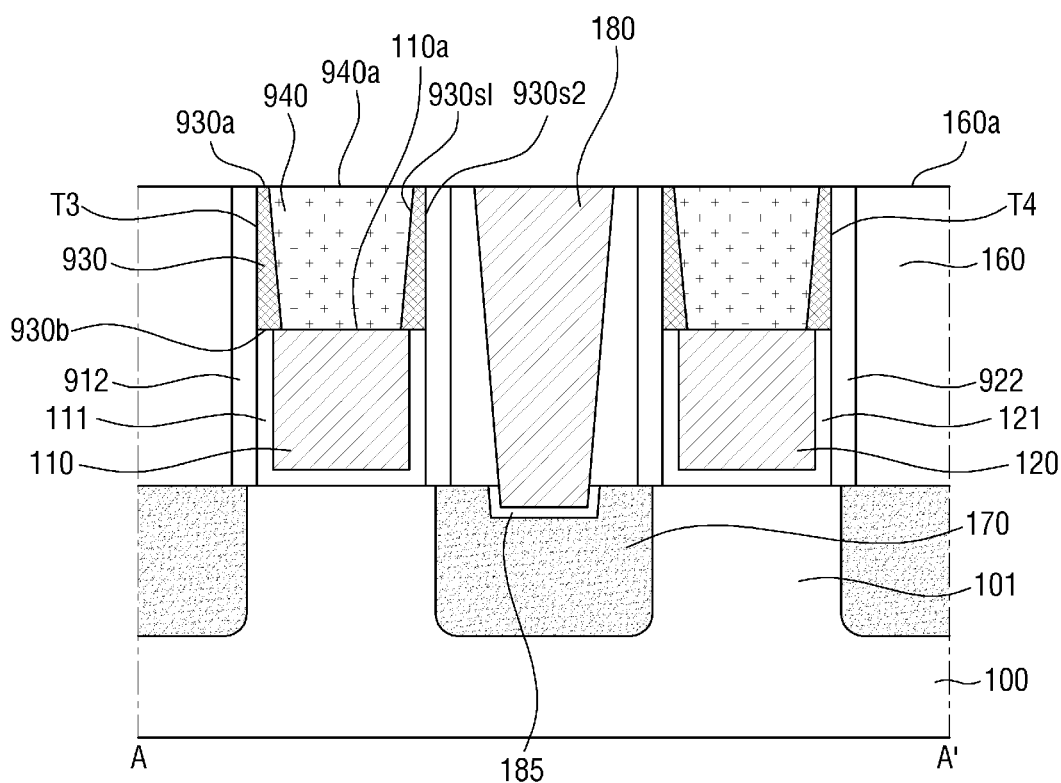
FIG. 11 is a cross-sectional view for explaining a semiconductor device according to an example embodiment.
Figure 11:
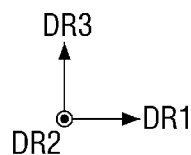

FIG. 11 is a cross-sectional view for explaining a semiconductor device according to some other embodiments of the present disclosure.

Referring to FIG. 11, in the semiconductor device according to some other embodiments of the present disclosure, each of a first gate spacer 912 and a second gate spacer 922 may extend to the upper surface 160a of the interlayer insulating layer 160.

A third trench T3 may be formed on the first gate electrode 110 and the first gate insulating film 111 between the first gate spacers 912. The fourth trench T4 may be formed on the second gate electrode 120 and the second gate insulating film 121 between the second gate spacers 922.

A first capping pattern 930 may be disposed in the third trench T3 along side walls of the third trench T3. Also, the first capping pattern 930 may be disposed in the fourth trench T4 along side walls of the fourth trench T4.

A lower surface 930b of the first capping pattern 930 may be in contact with each of the first gate insulating film 111 and the second gate insulating film 121. The lower surface 930b of the first capping pattern 930 may be in contact with each of the first gate electrode 110 and the second gate electrode 120. However, embodiments are not limited thereto.

The first capping pattern 930 may comprise a first side wall 930s1 being in contact with the second capping pattern 940 and having a inclined profile, and a second side wall 930s2 being in contact with the interlayer insulating layer 160.

The first capping pattern 930 may include silicon oxycarbide (SiOC). The first capping pattern 930 may include carbon of a first atomic ratio. The first atomic ratio may be, for example, 18% to 24%.

A second capping pattern 940 may be disposed on the first capping pattern 930 in each of the third trench T3 and the fourth trench T4. The second capping pattern 940 may completely fill the remaining portions in each of the third trench T3 and the fourth trench T4.

The second capping pattern 940 may include a material different from the first capping pattern 930. The second capping pattern 940 may include, for example, silicon nitride (SiN). That is, the first capping pattern 930 may include silicon oxycarbide (SiOC), and the second capping pattern 940 may include silicon nitride (SiN).

An upper surface 930a of the first capping pattern 930, an upper surface 940a of the second capping pattern 940 and the upper surface 160a of the interlayer insulating layer 160 may be formed on the same plane.

Hereinafter, a semiconductor device according to some other embodiments of the present disclosure will be explained with reference to FIG. 12. Differences from the semiconductor device shown in FIG. 11 will be mainly explained.

Figure 12:
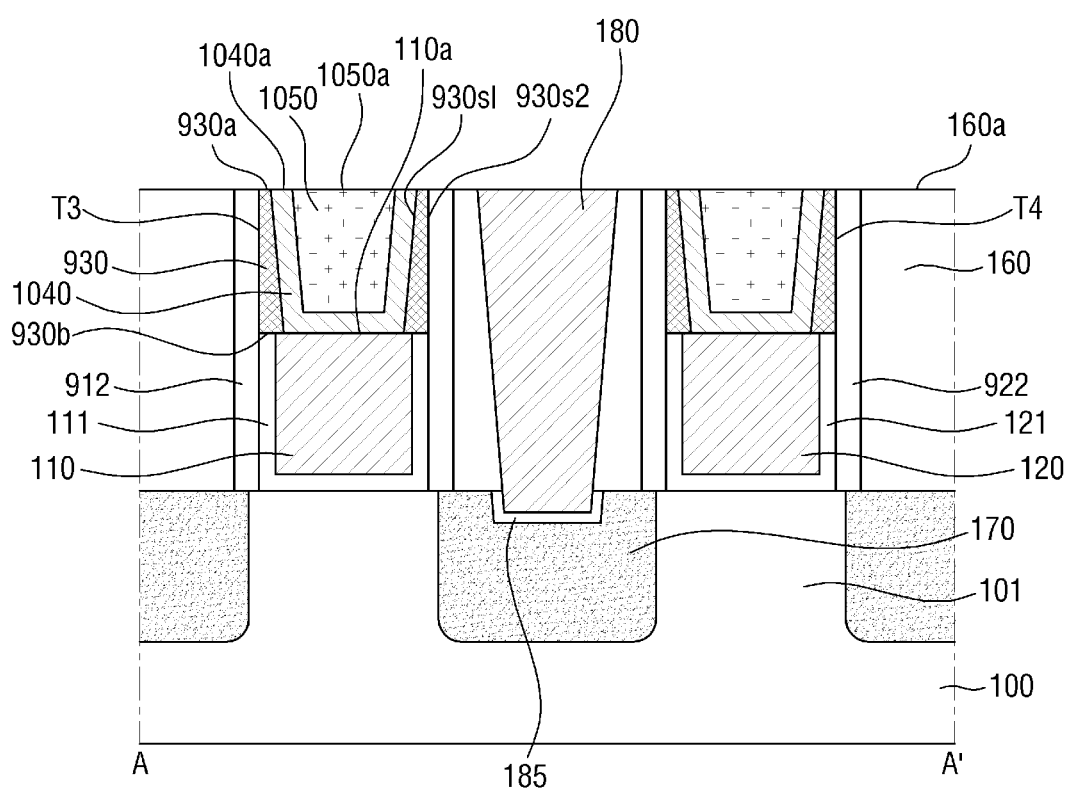
FIG. 12 is a cross-sectional view for explaining a semiconductor device according to an example embodiment.
Figure 12:
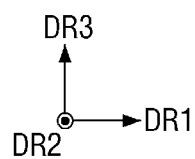

FIG. 12 is a cross-sectional view for explaining a semiconductor device according to some other embodiments of the present disclosure.

Referring to FIG. 12, in the semiconductor device according to some other embodiments of the present disclosure, a second capping pattern 1040 and a third capping pattern 1050 may be disposed on each of the first gate electrode 110 and the second gate electrode 120.

The second capping pattern 1040 may be disposed in the third trench T3 along the first side wall 930s1 of the first capping pattern 930 and the upper surface 110a of the first gate electrode 110. Also, the second capping pattern 1040 may be disposed in the fourth trench T4 along the first side wall 930s1 of the first capping pattern 930 and the upper surface of the second gate electrode 120. The second capping pattern 1040 may be, for example, conformally disposed. However, embodiments are not limited thereto.

The second capping pattern 1040 may include silicon oxycarbide (SiOC). The second capping pattern 1040 may include carbon of a second atomic ratio. The second atomic ratio may be, for example, 12% to 18%. The second atomic ratio may be smaller than the first atomic ratio. That is, the second atomic ratio of carbon contained in the second capping pattern 1040 may be smaller than the first atomic ratio of carbon contained in the first capping pattern 930.

The third capping pattern 1050 may be disposed on the second capping pattern 1040 in each of the third trench T3 and the fourth trench T4. The third capping pattern 1050 may completely fill the remaining portions in each of the third trench T3 and the fourth trench T4.

The third capping pattern 1050 may include a material different from the first capping pattern 930 and the second capping pattern 1040. The third capping pattern 1050 may include, for example, silicon nitride (SiN). That is, each of the first capping pattern 930 and the second capping pattern 1040 may include silicon oxycarbide (SiOC), and the third capping pattern 1050 may include silicon nitride (SiN).

Each of an upper surface 930a of the first capping pattern 930, an upper surface 1040a of the second capping pattern 1040, an upper surface 1050a of the third capping pattern 1050 and an upper surface 160a of the interlayer insulating layer 160 may be formed on the same plane.

Hereinafter, a semiconductor device according to some other embodiments of the present disclosure will be explained with reference to FIG. 13. Differences from the semiconductor device shown in FIGS. 1 to 3 will be mainly explained.

Figure 13:
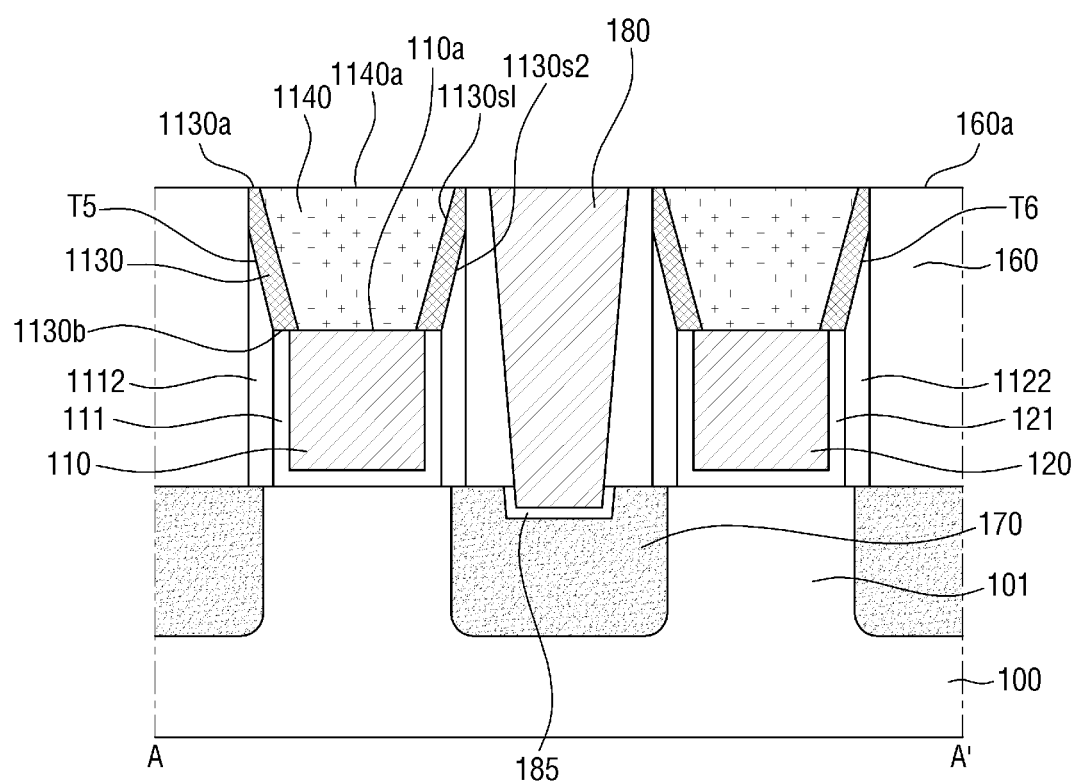
FIG. 13 is a cross-sectional view for explaining a semiconductor device according to an example embodiment.
Figure 13:
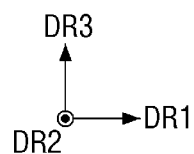

FIG. 13 is a cross-sectional view for explaining a semiconductor device according to some other embodiments of the present disclosure.

Referring to FIG. 13, in the semiconductor device according to some other embodiments of the present disclosure, a first gate spacer 1112 may extend upward from the upper surface 110a of the first gate electrode 110. Also, a second gate spacer 1122 may extend upward from the upper surface of the second gate electrode 120.

The upper surface of the first gate spacer 1112 being in contact with a first capping pattern 1130 may have an inclined profile. Also, the upper surface of the second gate spacer 1122 being in contact with the first capping pattern 1130 may have an inclined profile.

A fifth trench T5 may be formed on the first gate electrode 110 and the first gate insulating film 111 between the first gate spacers 1112. A sixth trench T6 may be formed on the second gate electrode 120 and the second gate insulating film 121 between the second gate spacers 1122. Each of a part of the side walls of the fifth trench T5 and a part of the side walls of the sixth trench T6 may be defined by the interlayer insulating layer 160.

The first capping pattern 1130 may be disposed in the fifth trench T5 along the side walls of the fifth trench T5. Also, the first capping pattern 1130 may be disposed in the sixth trench T6 along the side walls of the sixth trench T6.

A lower surface 1130b of the first capping pattern 1130 may be in contact with each of the first gate insulating film 111 and the second gate insulating film 121. The lower surface 1130b of the first capping pattern 1130 may be in contact with each of the first gate electrode 110 and the second gate electrode 120. However, embodiments are not limited thereto.

The first capping pattern 1130 may comprise a first side wall 1130s1, and a second side wall 1130s2 opposite to the first side wall 1130s1. The first side wall 1130s1 of the first capping pattern 1130 may be in contact with the second capping pattern 1140 and may have an inclined profile. The second side wall 1130s2 of the first capping pattern 1130 may be in contact with each of the upper surface of the first gate spacer 1112 and the upper surface of the second gate spacer 1122, and may have an inclined profile.

The first capping pattern 1130 may include silicon oxycarbide (SiOC). The first capping pattern 1130 may include carbon of a first atomic ratio. The first atomic ratio may be, for example, 18% to 24%.

The second capping pattern 1140 may be disposed on the first capping pattern 1130 in each of the fifth trench T5 and the sixth trench T6. The second capping pattern 1140 may completely fill the remaining portions in each of the fifth trench T5 and the sixth trench T6.

The second capping pattern 1140 may include a material different from the first capping pattern 1130. The second capping pattern 1140 may include, for example, silicon nitride (SiN). That is, the first capping pattern 1130 may include silicon oxycarbide (SiOC), and the second capping pattern 1140 may include silicon nitride (SiN).

An upper surface 1130a of the first capping pattern 1130, an upper surface 1140a of the second capping pattern 1140, and the upper surface 160a of the interlayer insulating layer 160 may be formed on the same plane.

Hereinafter, a semiconductor device according to some other embodiments of the present disclosure will be explained with reference to FIG. 14. Differences from the semiconductor device shown in FIG. 13 will be mainly explained.

Figure 14:
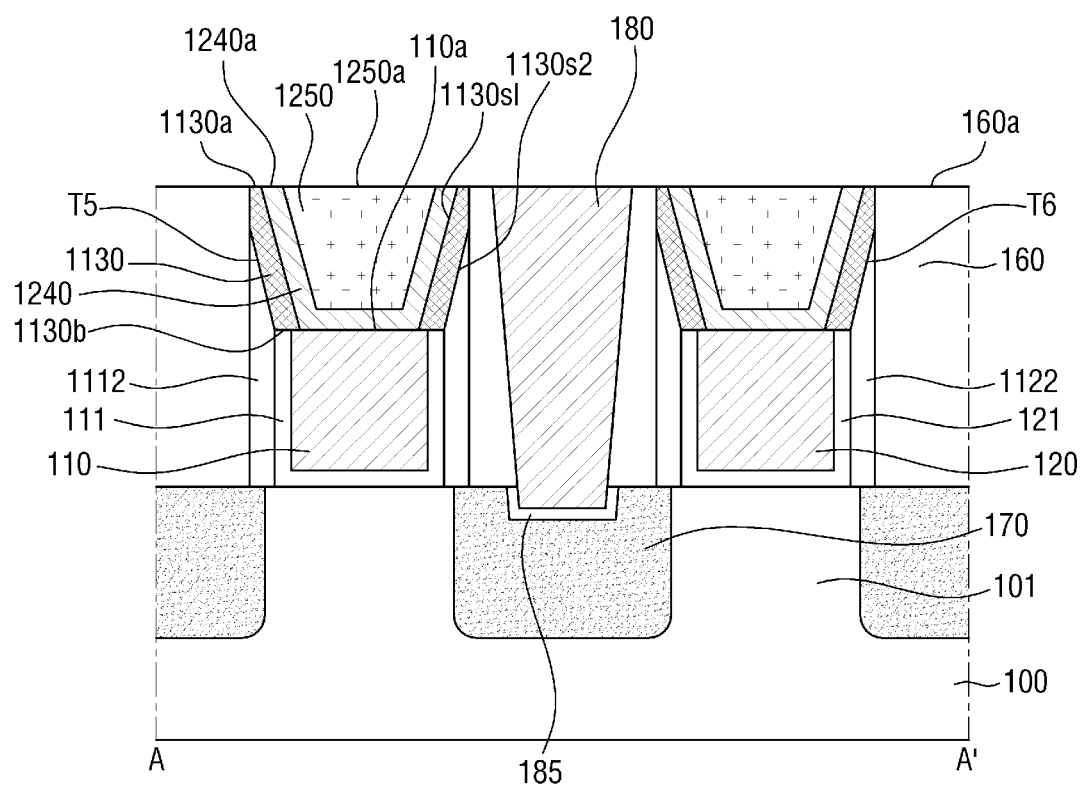
FIG. 14 is a cross-sectional view for explaining a semiconductor device according to an example embodiment.
Figure 14:
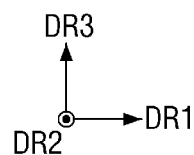

FIG. 14 is a cross-sectional view for explaining a semiconductor device according to some other embodiments of the present disclosure.

Referring to FIG. 14, in the semiconductor device according to some other embodiments of the present disclosure, a second capping pattern 1240 and a third capping pattern 1250 may be disposed on each of the first gate electrode 110 and the second gate electrode 120.

The second capping pattern 1240 may be disposed in the fifth trench T5 along the first side wall 1130s1 of the first capping pattern 1130 and the upper surface 110a of the first gate electrode 110. Also, the second capping pattern 1240 may be disposed in the sixth trench T6 along the first side wall 1130s1 of the first capping pattern 1130 and the upper surface of the second gate electrode 120. The second capping pattern 1240 may be, for example, conformally disposed. However, embodiments are not limited thereto.

The second capping pattern 1240 may include silicon oxycarbide (SiOC). The second capping pattern 1240 may include carbon of a second atomic ratio. The second atomic ratio may be, for example, 12% to 18%. The second atomic ratio may be smaller than the first atomic ratio. That is, the second atomic ratio of carbon contained in the second capping pattern 1240 may be smaller than the first atomic ratio of carbon contained in the first capping pattern 1130.

The third capping pattern 1250 may be disposed on the second capping pattern 1240 in each of the fifth trench T5 and the sixth trench T6. The third capping pattern 1250 may completely fill the remaining portions in each of the fifth trench T5 and the sixth trench T6.

The third capping pattern 1250 may include a material different from the first capping pattern 1130 and the second capping pattern 1240. The third capping pattern 1250 may include, for example, silicon nitride (SiN). That is, each of the first capping pattern 1130 and the second capping pattern 1240 may include silicon oxycarbide (SiOC), and the third capping pattern 1250 may include silicon nitride (SiN).

The upper surface 1130a of the first capping pattern 1130, an upper surface 1240a of the second capping pattern 1240, an upper surface 1250a of the third capping pattern 1250 and the upper surface 160a of the interlayer insulating layer 160 may be formed on the same plane.

Hereinafter, a semiconductor device according to some other embodiments of the present disclosure will be explained with reference to FIG. 15. Differences from the semiconductor device shown in FIGS. 1 to 3 will be mainly explained.

Figure 15:
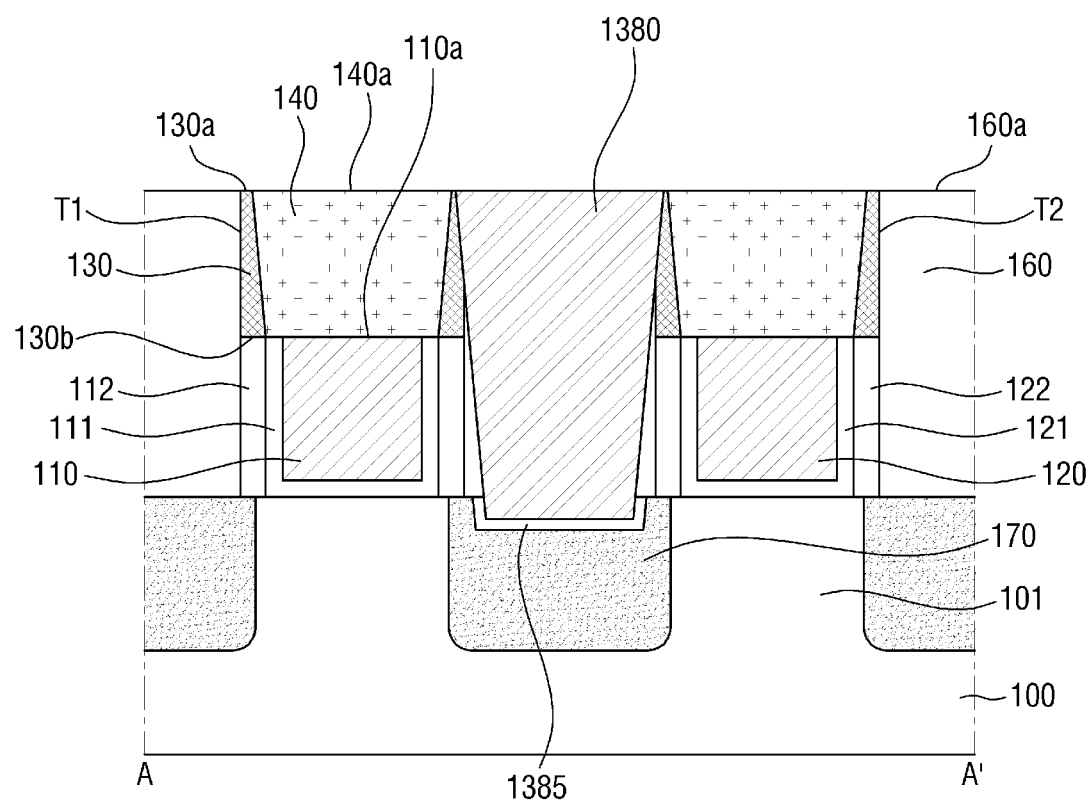
FIG. 15 is a cross-sectional view for explaining a semiconductor device according to an example embodiment.
Figure 15:
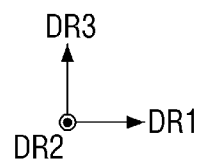

FIG. 15 is a cross-sectional view for explaining a semiconductor device according to some other embodiments of the present disclosure.

Referring to FIG. 15, in the semiconductor device according to some other embodiment of the present disclosure, a source/drain contact 1380 may be in contact with the first capping pattern 130. In some other embodiments, the source/drain contact 1380 may be in contact with each of the first capping pattern 130 and the second capping pattern 140. A silicide film 1385 may be disposed between the source/drain region 170 and the source/drain contact 1380.

A semiconductor device according to some other embodiments of the present disclosure will be explained below with reference to FIG. 16. Differences from the semiconductor device shown in FIGS. 1 to 3 will be mainly explained.

Figure 16:
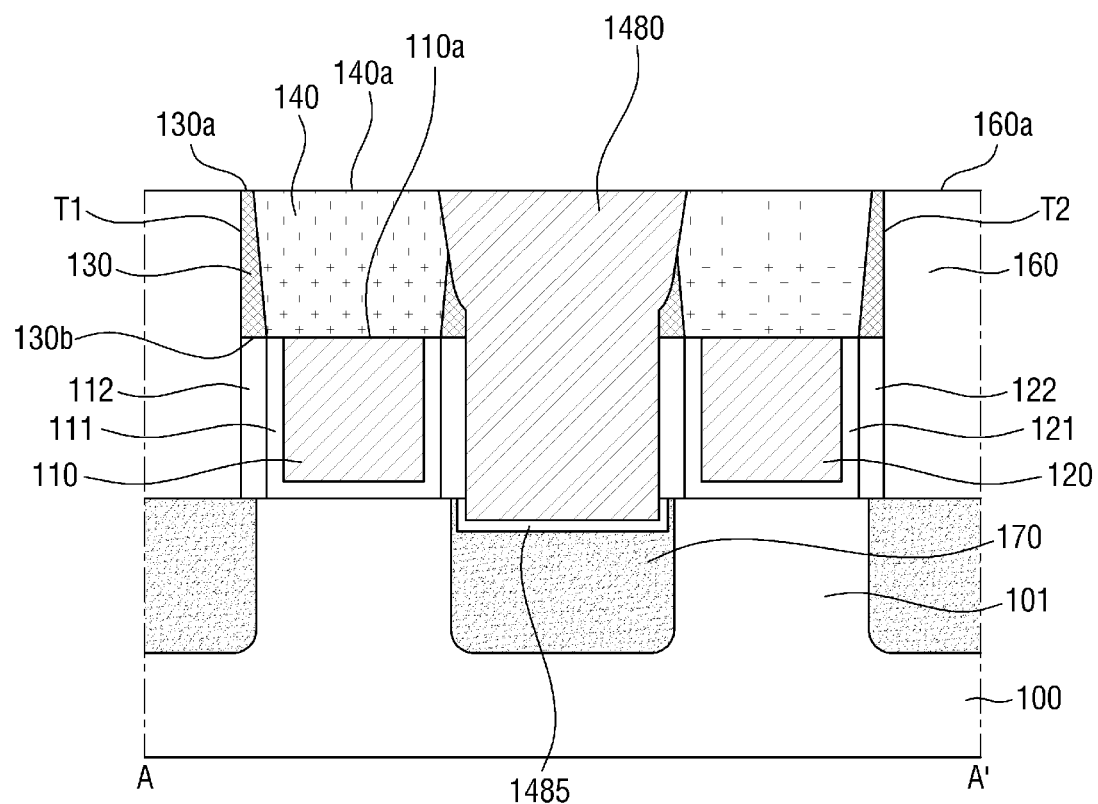
FIG. 16 is a cross-sectional view for explaining a semiconductor device according to an example embodiment.
Figure 16:
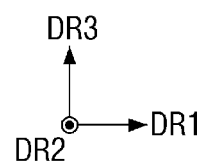

FIG. 16 is a cross-sectional view for explaining a semiconductor device according to some other embodiments of the present disclosure.

Referring to FIG. 16, in the semiconductor device according to another embodiment of the present disclosure, a source/drain contact 1480 may be in contact with each of the first capping pattern 130 and the second capping pattern 140. The source/drain contact 1480 may be in contact with each of the first gate spacer 112 and the second gate spacer 122. The interlayer insulating layer 160 may not be disposed between the source/drain contact 1480 and the first gate spacer 112, and between the source/drain contact 1480 and the second gate spacer 122. A silicide film 1485 may be disposed between the source/drain region 170 and the source/drain contact 1480.

Hereinafter, a semiconductor device according to some other embodiments of the present disclosure will be explained with reference to FIGS. 17 and 18. Differences from the semiconductor device shown in FIGS. 1 to 3 will be mainly explained.

Figure 17:
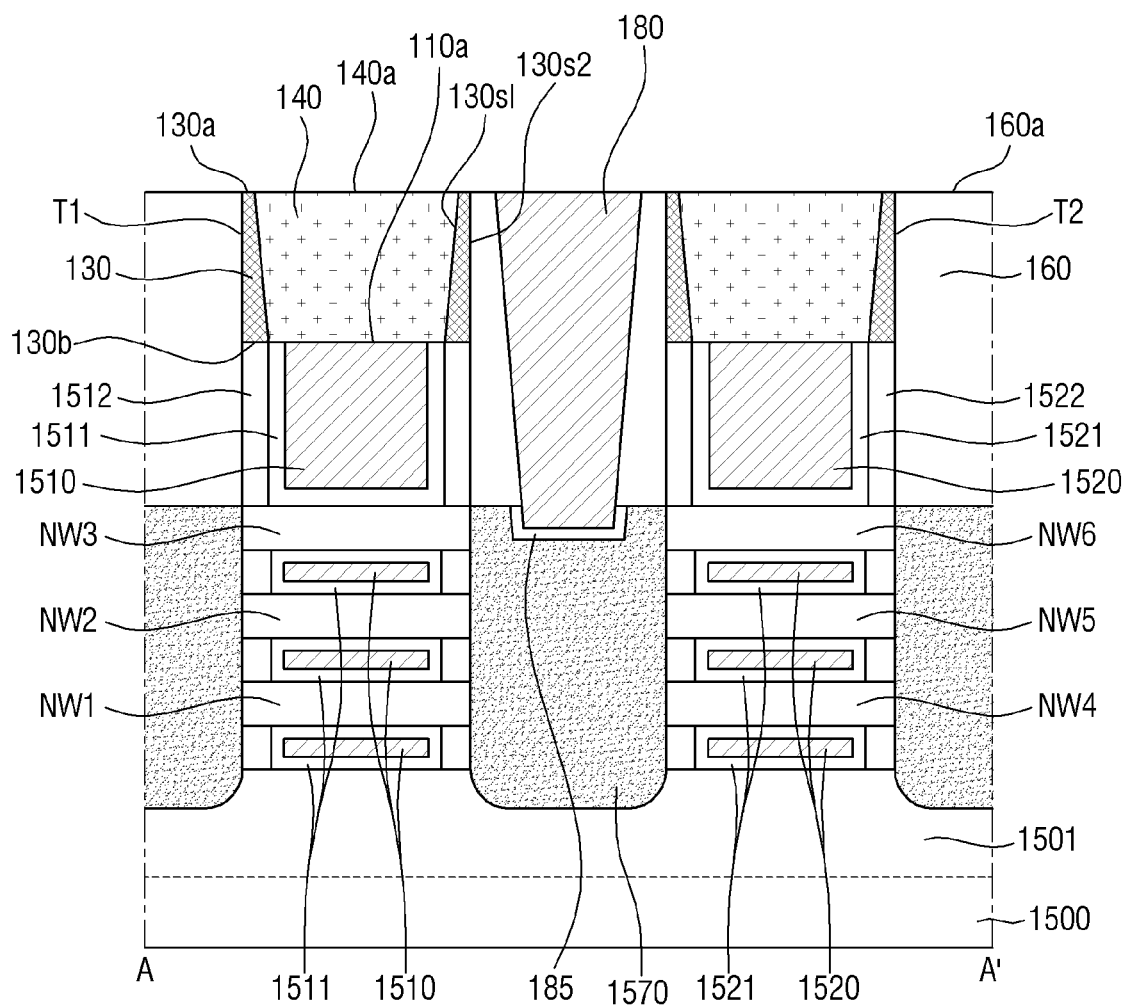
FIGS. 17 and 18 are cross-sectional views for explaining a semiconductor device according to an example embodiment.
Figure 18:
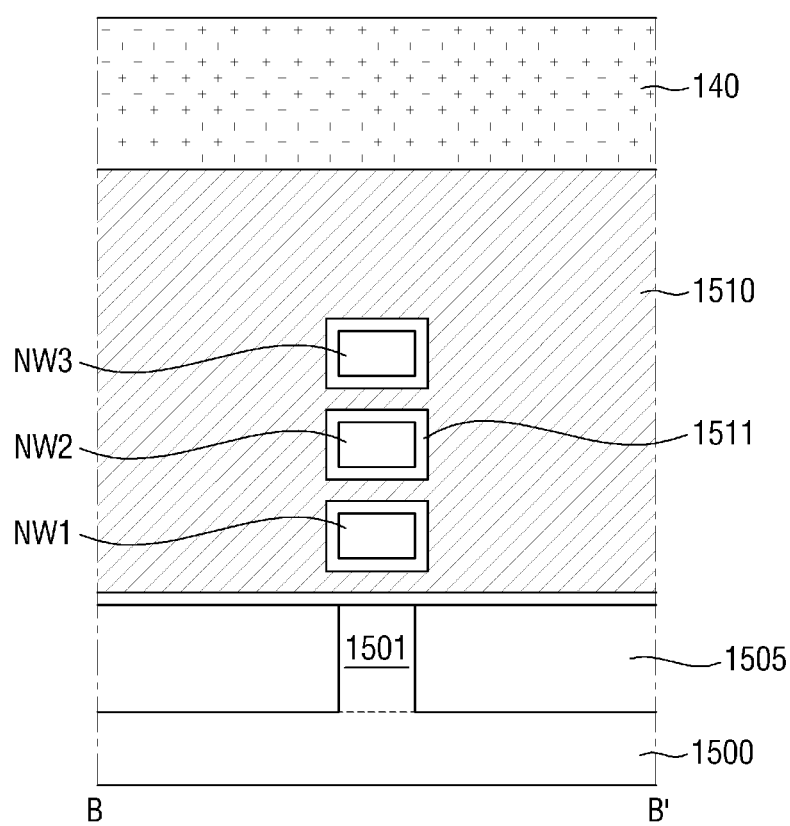

FIGS. 17 and 18 are cross-sectional views for explaining a semiconductor device according to some other embodiments of the present disclosure.

Referring to FIGS. 17 and 18, the semiconductor device according to some other embodiments of the present disclosure may comprise an MBCFET™ (Multi-Bridge Channel Field Effect Transistor).

Specifically, the semiconductor device according to some other embodiments of the present disclosure may comprise a plurality of nanowires sequentially stacked on a substrate 1500 while being spaced apart from each other in a third direction DR3.

First to third nanowires NW1, NW2, and NW3 may be sequentially stacked on an active pattern 1501 while being spaced apart from each other in the third direction DR3. Each of the first to third nanowires NW1, NW2, and NW3 may extend in the first direction DR1.

Fourth to sixth nanowires NW4, NW5, and NW6 may be sequentially stacked on the active pattern 1501 while being spaced apart from each other in the third direction DR3. Each of the fourth to sixth nanowires NW4, NW5, and NW6 may extend in the first direction DR1. Each of the fourth to sixth nanowires NW4, NW5, and NW6 may be spaced apart from each of the first to third nanowires NW1, NW2, and NW3 in the first direction DR1.

Although FIG. 17 and FIG. 18 show that three nanowires are stacked in the third direction DR3, this is for convenience of explanation, and embodiments are not limited thereto.

A first gate electrode 1510 may surround each of the first to third nanowires NW1, NW2, and NW3. A second gate electrode 1520 may surround each of the fourth to sixth nanowires NW4, NW5, and NW6.

A first gate spacer 1512 may be disposed on both sides of the first gate electrode 1510. A second gate spacer 1522 may be disposed on both sides of the second gate electrode 1520.

A first gate insulating film 1511 may be disposed between each of the first to third nanowires NW1, NW2, and NW3 and the first gate spacer 1512, between the first gate spacer 1512 and the first gate electrode 1510, between the active pattern 1501 and the first gate electrode 1510, and between the field insulating layer 1505 and the first gate electrode 1510, respectively.

A second gate insulating film 1521 may be disposed between each of the fourth to sixth nanowires NW4, NW5, and NW6 and the second gate electrode 1520, between the second gate spacer 1522 and the second gate electrode 1520, between the active pattern 1501 and the second gate electrode 1520, and between the field insulating layer 1505 and the second gate electrode 1520, respectively.

A source/drain region 1570 may be disposed on at least the one side of the first to third nanowires NW1, NW2, and NW3. Also, the source/drain region 1570 may be disposed on at least one side of the fourth to sixth nanowires NW4, NW5, and NW6.

Hereinafter, a semiconductor device according to some other embodiments of the present disclosure will be explained with reference to FIG. 19. Differences from the semiconductor device shown in FIGS. 1 to 3 will be mainly explained.

Figure 19:
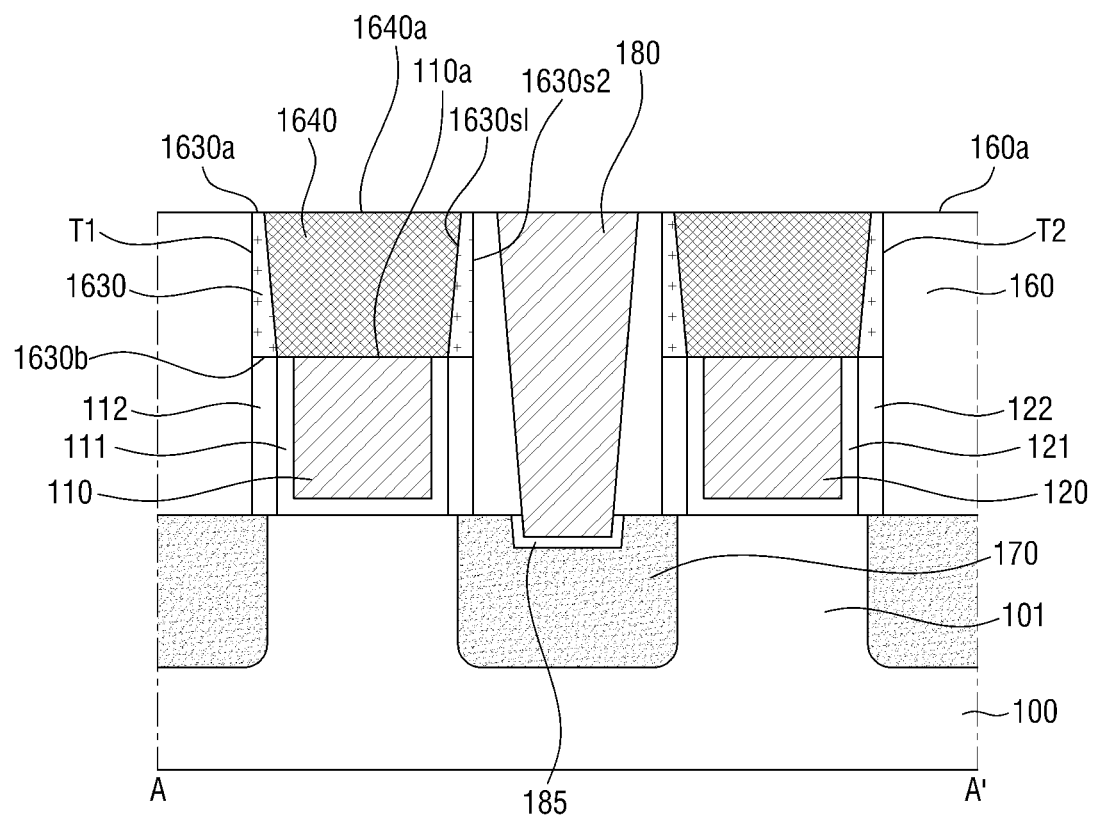
FIG. 19 is a cross-sectional view for explaining a semiconductor device according to an example embodiment.

FIG. 19 is a cross-sectional view for explaining a semiconductor device according to some other embodiments of the present disclosure.

Referring to FIG. 19, in the semiconductor device according to some other embodiments of the present disclosure, a first capping pattern 1630 may include, for example, silicon nitride (SiN). In some other embodiments, the first capping pattern 1630 may include at least one of silicon carbonitride (SiCN) and silicon oxynitride (SiON). The second capping pattern 1640 may include silicon oxycarbide (SiOC). The second capping pattern 1640 may include carbon of a first atomic ratio. The first atomic ratio may be, for example, 18% to 24%.

The first capping pattern 1630 may be disposed along side walls of each of the first trench T1 and the second trench T2. The first capping pattern 1630 may comprise a first side wall 1630s1, and a second side wall 1630s2 opposite to the first side wall 1630s1. The first side wall 1630s1 of the first capping pattern 1630 may be in contact with the second capping pattern 1640 and have an inclined profile. The second side wall 1630s2 of the first capping pattern 1630 may be in contact with the interlayer insulating layer 160.

The second capping pattern 1640 may be disposed on the first capping pattern 1630 in each of the first trench T1 and the second trench T2. The second capping pattern 1640 may completely fill the remaining portions in each of the first trench T1 and the second trench T2.

A lower surface 1630b of the first capping pattern 1630 may be in contact with the upper surface of the first gate spacer 112. An upper surface 1630a of the first capping pattern 1630, an upper surface 1640a of the second capping pattern 1640 and an upper surface 160a of the interlayer insulating layer 160 may be formed on the same plane.

In the semiconductor device according to an example embodiment, by placing the first capping pattern 1630 having a relatively high etching resistance at the outermost part of the capping pattern, it is possible to effectively guide the etching process for forming a source/drain contact 180.

Hereinafter, a semiconductor device according to some other embodiments of the present disclosure will be explained with reference to FIG. 20. Differences from the semiconductor device shown in FIG. 19 will be mainly explained.

Figure 20:
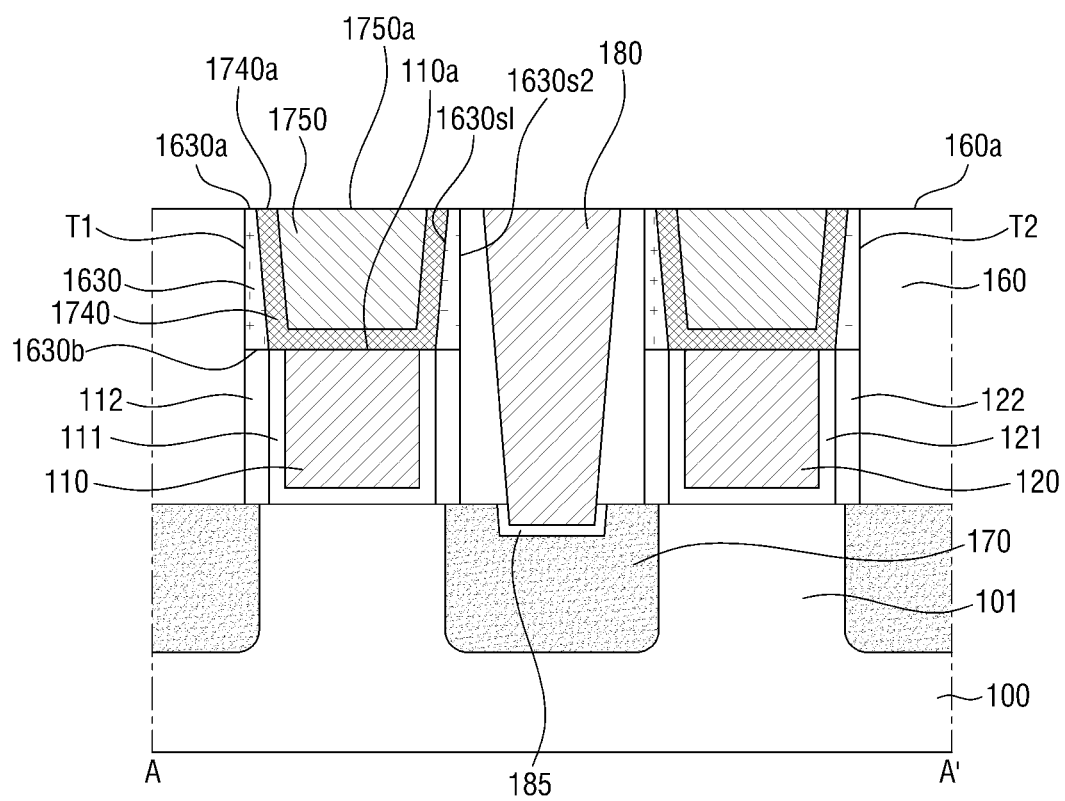
FIG. 20 is a cross-sectional view for explaining a semiconductor device according to an example embodiment.
Figure 20:
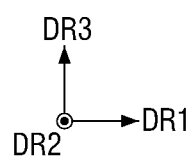

FIG. 20 is a cross-sectional view for explaining a semiconductor device according to some other embodiments of the present disclosure.

Referring to FIG. 20, in the semiconductor device according to some other embodiments of the present disclosure, a second capping pattern 1740 and a third capping pattern 1750 may be disposed on each of the first gate electrode 110 and the second gate electrode 120.

The second capping pattern 1740 may be disposed in the first trench T1 along the first side wall 1630s1 of the first capping pattern 1630 and the upper surface 110a of the first gate electrode 110. Also, the second capping pattern 1740 may be disposed in the second trench T2 along the first side wall 1630s1 of the first capping pattern 1630 and the upper surface of the second gate electrode 120. The second capping pattern 1740 may be, for example, conformally disposed.

The third capping pattern 1750 may be disposed on the second capping pattern 1740 in each of the first trench T1 and the second trench T2. The third capping pattern 1750 may completely fill the remaining portions in each of the first trench T1 and the second trench T2.

The first capping pattern 1630 may include, for example, silicon nitride (SiN). In some other embodiments, the first capping pattern 1630 may include at least one of silicon carbonitride (SiCN) and silicon oxynitride (SiON). Each of the second capping pattern 1740 and the third capping pattern 1750 may include silicon oxycarbide (SiOC).

The second capping pattern 1740 may include carbon of a first atomic ratio. The first atomic ratio may be, for example, 18% to 24%. The third capping pattern 1750 may include carbon of a second atomic ratio that is smaller than the first atomic ratio. The second atomic ratio may be, for example, 12% to 18%.

An upper surface 1630a of the first capping pattern 1630, an upper surface 1740a of the second capping pattern 1740, an upper surface 1750a of the third capping pattern 1750, and an upper surface 160a of the interlayer insulating layer 160 may be formed on the same plane.

Hereinafter, a method for fabricating a semiconductor device according to an example embodiment will be explained with reference to FIGS. 2 and 21 to 28.

FIGS. 21 to 28 are intermediate stage diagrams for explaining a method for fabricating a semiconductor device according to an example embodiment.

Figure 21:
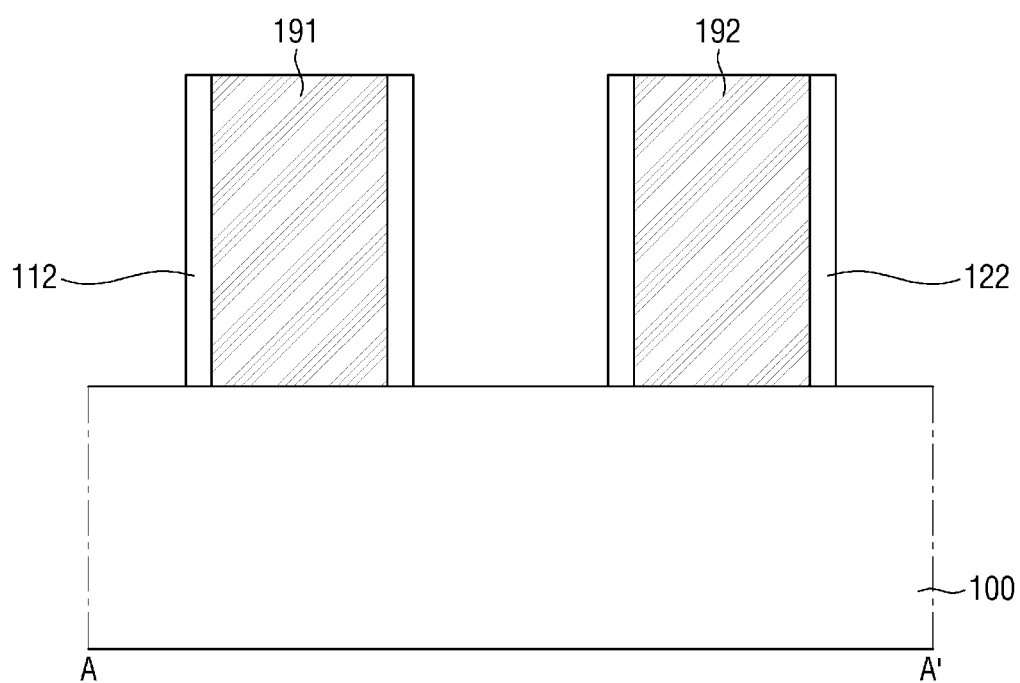
FIGS. 21 to 28 are intermediate stage diagrams for explaining a method for fabricating a semiconductor device according to an example embodiment.
Figure 21:
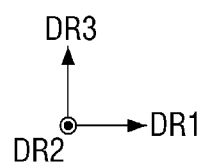

Referring to FIG. 21, a first dummy gate 191 and a second dummy gate 192 may be formed on the substrate 100. Each of the first dummy gate 191 and the second dummy gate 192 may extend in the second direction DR2. The first dummy gate 191 may be spaced apart from the second dummy gate 192 in the first direction DR1.

Subsequently, a first gate spacer 112 may be formed on the side walls of the first dummy gate 191. Also, a second gate spacer 122 may be formed on the side walls of the second dummy gate 192.

Figure 22:
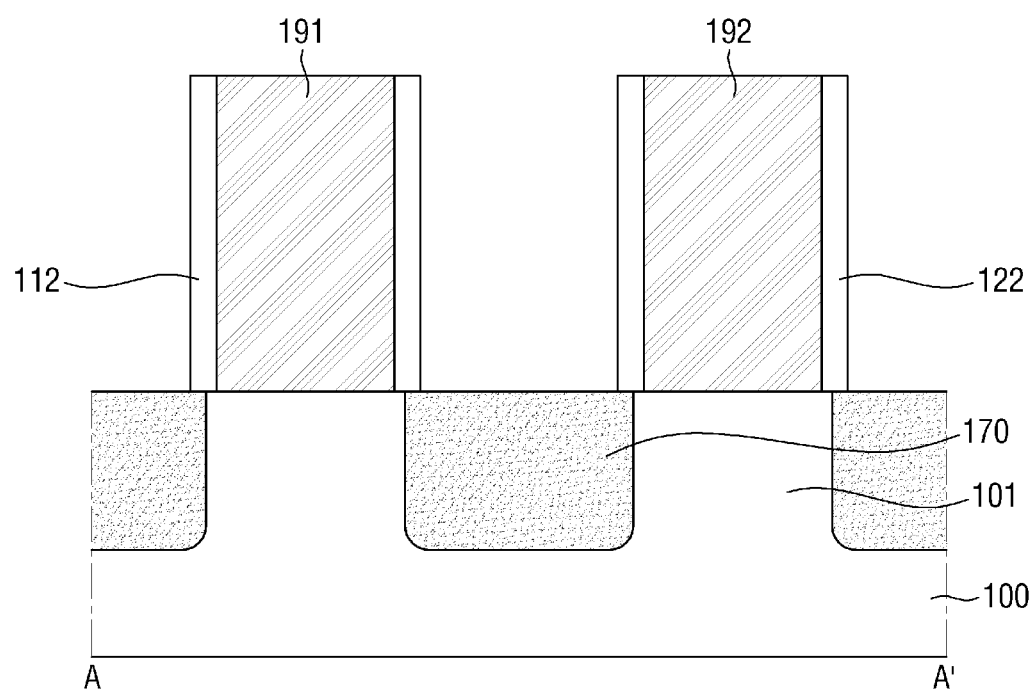
Figure 22:
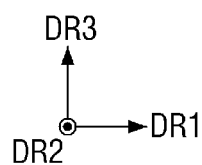

Referring to FIG. 22, the substrate 100 may be etched, using the first dummy gate 191, the second dummy gate 192, the first gate spacer 112 and the second gate spacer 122 as a mask. Next a source/drain region 170 may be formed in the etched region of the substrate 100.

Figure 23:
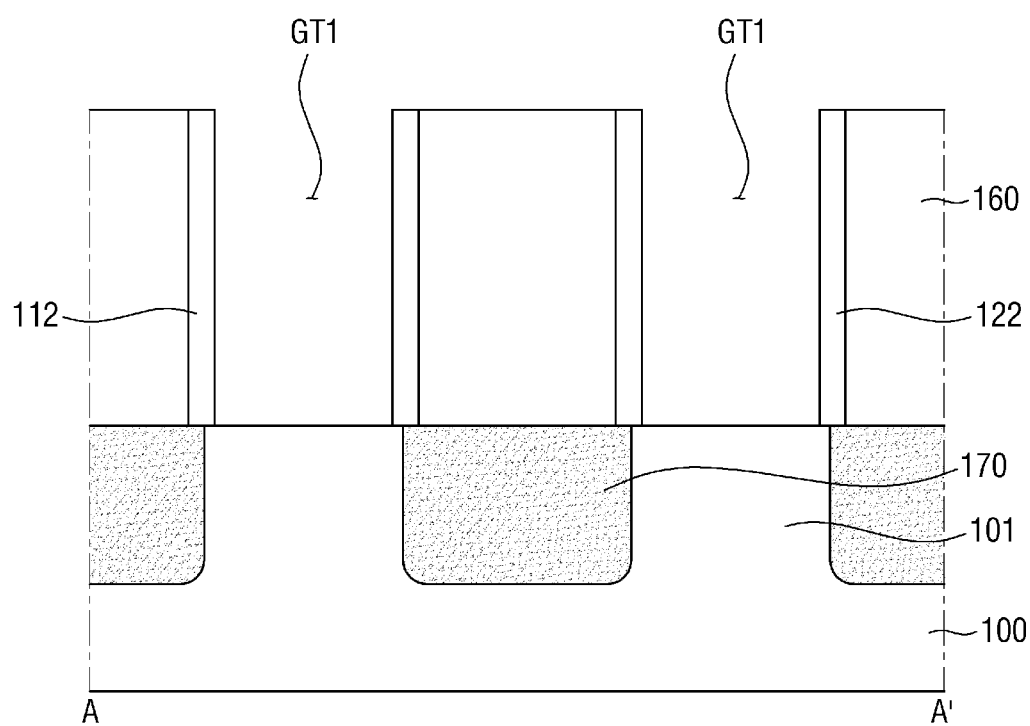

Referring to FIG. 23, an interlayer insulating layer 160 may be formed to cover the first dummy gate 191, the second dummy gate 192, the first gate spacer 112 and the second gate spacer 122.

Next, a planarization process (for example, a CMP process) may be performed to expose the upper surfaces of each of the first dummy gate 191 and the second dummy gate 192.

Subsequently, each of the first dummy gate 191 and the second dummy gate 192 may be removed. As a result, a first gate trench GT1 may be formed between the first gate spacers 112, and a second gate trench GT2 may be formed between the second gate spacers 122.

Figure 24:
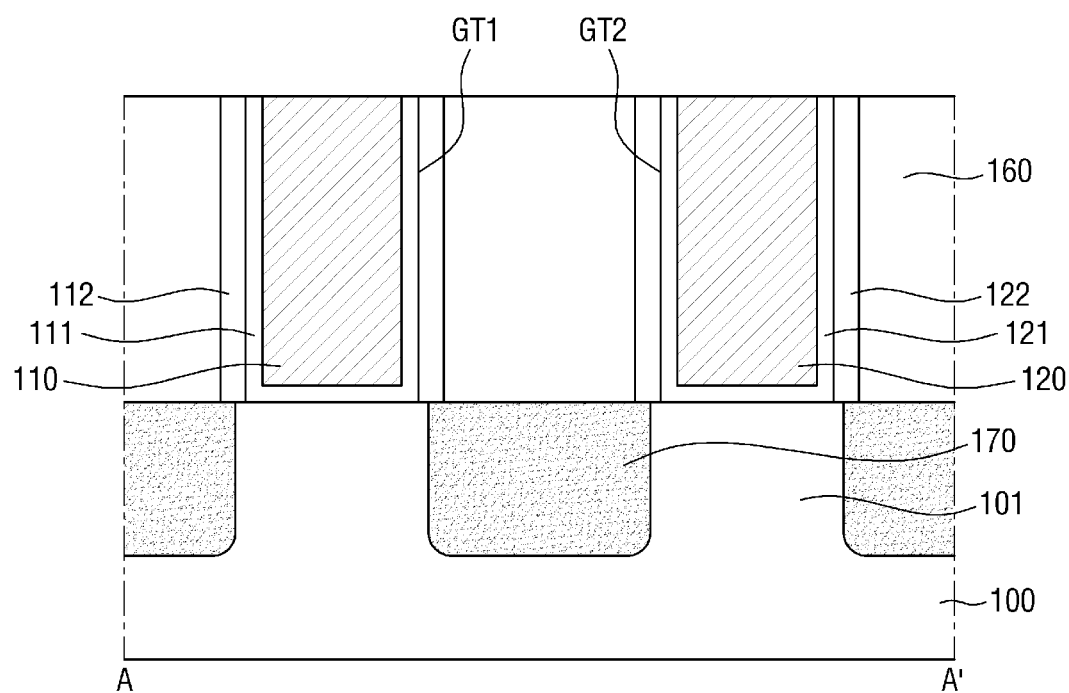
Figure 24:
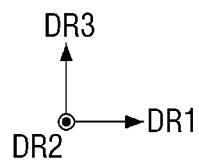

Referring to FIG. 24, a first gate insulating film 111 and a first gate electrode 110 may be sequentially formed in the first gate trench GT1. Also, a second gate insulating film 121 and a second gate electrode 120 may be sequentially formed in the second gate trench GT2.

Figure 25:
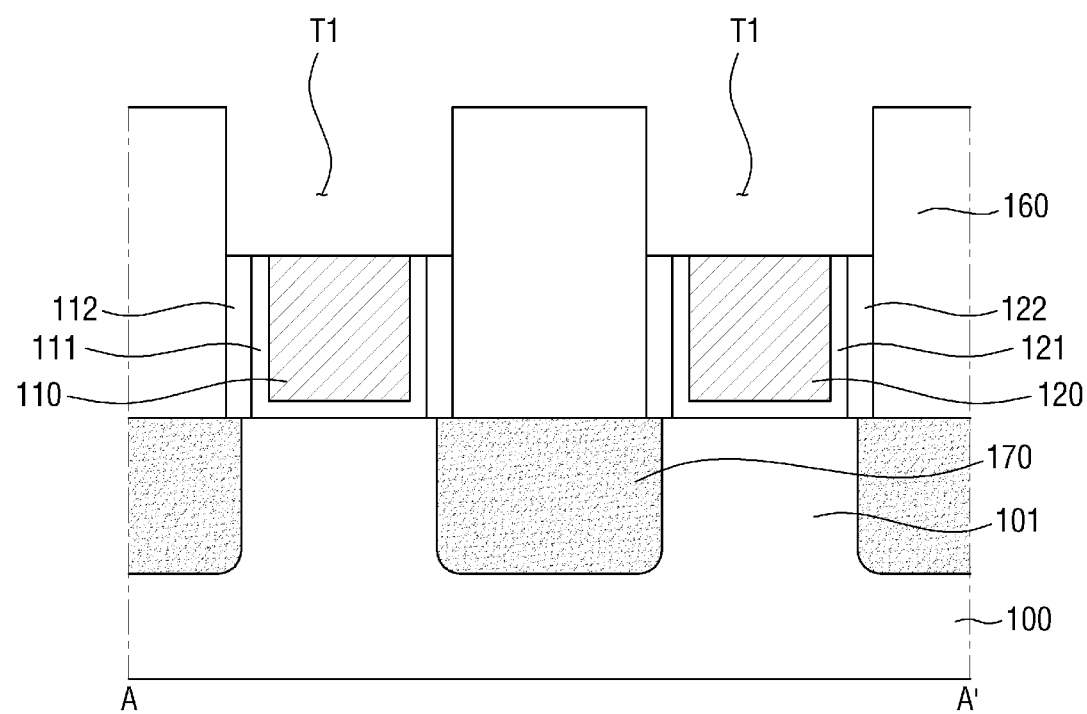
Figure 25:
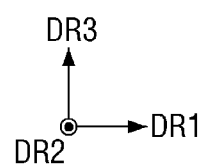

Referring to FIG. 25, a first trench T1 may be formed, by partially removing each of the first gate electrode 110, the first gate insulating film 111 and the first gate spacer 112. Further, a second trench T2 may be formed, by partially removing each of the second gate electrode 120, the second gate insulating film 121 and the second gate spacer 122.

Figure 26:
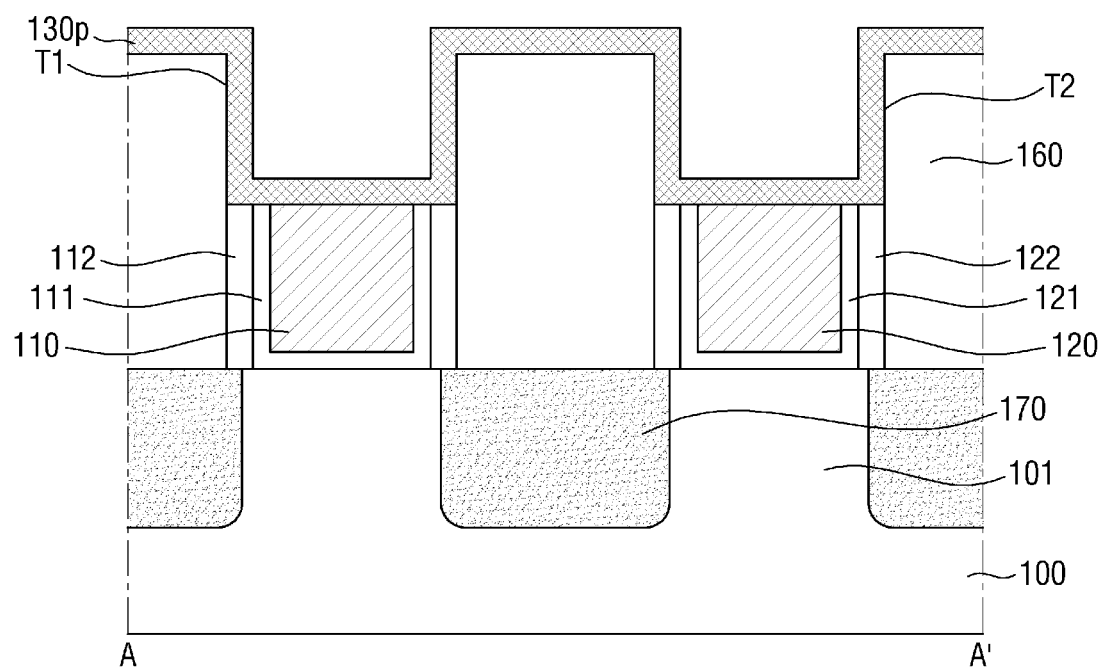
Figure 26:
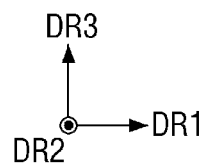

Referring to FIG. 26, a first capping film 130p may be conformally formed on the upper surface of the interlayer insulating layer 160, the side walls and the bottom surface of the first trench T1, and the side walls and the bottom surface of the second trench T2.

Figure 27:
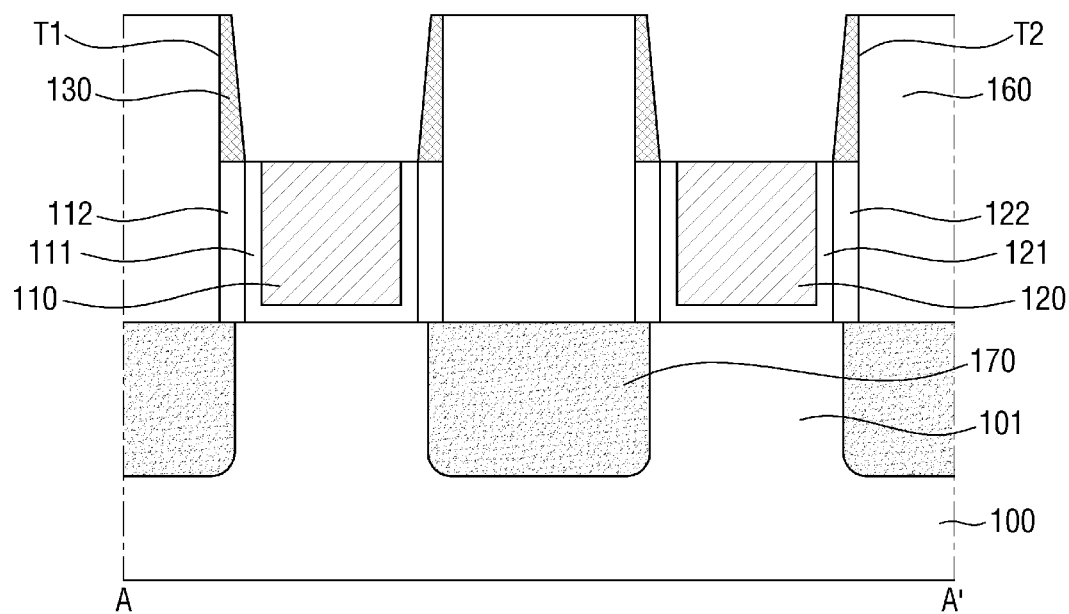
Figure 27:
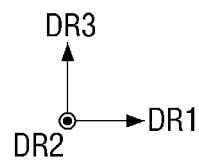

Referring to FIG. 27, a first capping film 130p formed on the upper surface of the interlayer insulating layer 160, the upper surface of the first gate electrode 110, and the upper surface of the second gate electrode 120 may be removed through an etch back process. In this case, the first capping film 130p formed on each of the side walls of the first trench T1 and the side walls of the second trench T2 may be partially removed. Accordingly, the first capping pattern 130 having side walls of an inclined profile may be formed.

Figure 28:
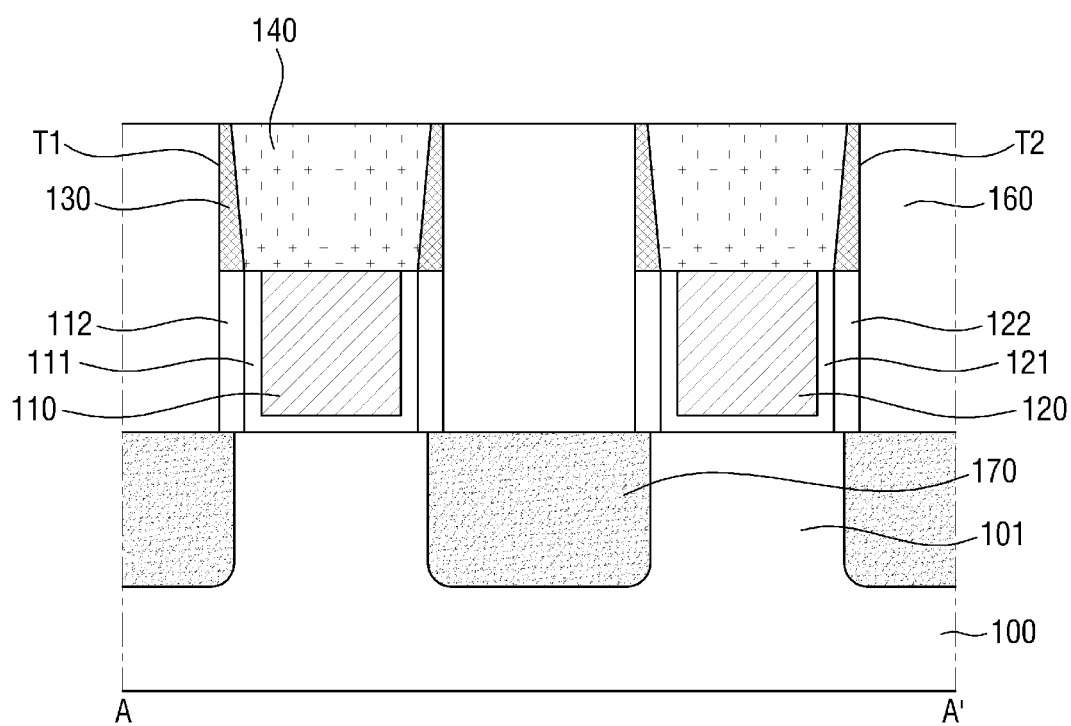
Figure 28:
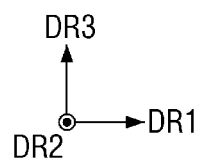

Referring to FIG. 28, the second capping pattern 140 may be filled on the first capping pattern 130 in each of the first trench T1 and the second trench T2.

Subsequently, by forming the source/drain contact 180 and the silicide film 185, the semiconductor device shown in FIG. 2 may be fabricated.

In concluding the detailed description, those skilled in the art will appreciate that many variations and modifications may be made to the example embodiments without substantially departing from the principles of the present disclosure. Therefore, the disclosed example embodiments of the disclosure are used in a generic and descriptive sense only and not for purposes of limitation.

The invention claimed is:

1. A semiconductor device comprising:
    a substrate;
    an active pattern extending in a first direction on the substrate;

a gate electrode extending in a second direction on the active pattern, the second direction intersecting the first direction;

a gate spacer extending in the second direction along side walls of the gate electrode;

an interlayer insulating layer contacting side walls of the gate spacer;

a trench formed on the gate electrode in the interlayer insulating layer;

a first capping pattern provided along side walls of the trench, at least one side wall of the first capping pattern having an inclined profile, wherein the first capping pattern decreases in width with increased distance from the substrate, a first side wall of the at least one side wall is in contact with a second capping pattern, and the first capping pattern is not in contact with the gate electrode; and the second capping pattern provided on the first capping pattern in the trench.

2. The semiconductor device of claim 1, wherein the first capping pattern includes silicon oxycarbide (SiOC), and the second capping pattern includes silicon nitride (SiN).

3. The semiconductor device of claim 1, wherein the first capping pattern includes silicon nitride (SiN), and the second capping pattern includes silicon oxycarbide (SiOC).

4. The semiconductor device of claim 1, wherein each of the first capping pattern and the second capping pattern includes silicon oxycarbide (SiOC), the first capping pattern includes first carbon of a first atomic ratio, and the second capping pattern includes second carbon of a second atomic ratio that is smaller than the first atomic ratio.

5. The semiconductor device of claim 4, wherein the first atomic ratio is 18% to 24% and the second atomic ratio is 12% to 18%.

6. The semiconductor device of claim 4, further comprising:

a third capping pattern provided on the second capping pattern in the trench, the third capping pattern including a material that is different from a material the first capping pattern and a material of the second capping pattern.

7. The semiconductor device of claim 4, further comprising:

a third capping pattern provided on the second capping pattern in the trench, wherein the third capping pattern includes silicon oxycarbide (SiOC), and the third capping pattern includes third carbon of a third atomic ratio that is smaller than the second atomic ratio.

8. The semiconductor device of claim 1, wherein an upper surface of the first capping pattern is on a same plane as an upper surface of the second capping pattern.

9. The semiconductor device of claim 1, wherein an upper surface of the interlayer insulating layer is on a same plane as an upper surface of the first capping pattern.

10. The semiconductor device of claim 1, wherein an upper surface of the gate electrode is on a same plane as an upper surface of the gate spacer.

11. The semiconductor device of claim 1, wherein the second capping pattern contacts the gate electrode.

12. The semiconductor device of claim 1, wherein a second side wall that is opposite to the first side wall contacts the interlayer insulating layer.

13. The semiconductor device of claim 1, further comprising:

a first nanowire and a second nanowire sequentially stacked on the substrate in a third direction that is perpendicular to the first direction and the second direction, wherein the gate electrode surrounds each of the first nanowire and the second nanowire.

14. A semiconductor device comprising:

a substrate;

an active pattern extending in a first direction on the substrate;

a gate electrode extending in a second direction on the active pattern, the second intersecting the first direction;

a gate spacer extending in the second direction along side walls of the gate electrode;

an interlayer insulating layer contacting side walls of the gate spacer;

a trench formed on the gate electrode in the interlayer insulating layer;

a first capping pattern provided along walls of the trench, the first capping pattern including silicon oxycarbide (SiOC), and including carbon of a first atomic ratio; and a second capping pattern provided on the first capping pattern in the trench, the second capping pattern including silicon oxycarbide (SiOC), and including carbon of a second atomic ratio that is smaller than the first atomic ratio.

15. The semiconductor device of claim 14, wherein at least one of side wall of the first capping pattern has an inclined profile.

16. The semiconductor device of claim 14, further comprising:

a third capping pattern provided on the second capping pattern in the trench, the third capping pattern including silicon oxycarbide (SiOC), wherein the third capping pattern includes carbon of a third atomic ratio that is smaller than the second atomic ratio.

17. The semiconductor device of claim 16, wherein the first atomic ratio is 18% to 24%, the second atomic ratio is 12% to 18%, and the third atomic ratio is 6% to 12%.

18. The semiconductor device of claim 14, wherein a lower surface of the first capping pattern contacts an upper surface of the gate spacer.

19. The semiconductor device of claim 14, wherein the first capping pattern includes a material that is different from a material of the gate spacer.

20. A semiconductor device comprising:

a substrate;

an active pattern extending in a first direction on the substrate;

a gate electrode extending in a second direction on the active pattern, the second direction intersecting the first direction;

a gate spacer extending in the second direction along side walls of the gate electrode;

an interlayer insulating layer contacting side walls of the gate spacer;

a trench formed on the gate electrode in the interlayer insulating layer;

a first capping pattern provided along side walls of the trench, wherein the first capping pattern comprises a first side wall and a second side wall opposite to the first side wall, the first side wall has an inclined profile, the first capping pattern decreases in width with increased distance from the substrate, the second side wall contacts the interlayer insulating layer, the first capping pattern includes silicon oxycarbide (SiOC), and the first capping pattern is not in contact with the gate electrode;

a second capping pattern provided on the first capping pattern in the trench, the second capping pattern contacting the first side wall of the first capping pattern, the second capping pattern including a material different from a material of the first capping pattern;

a source/drain region provided on at least one of side of the gate electrode; and a source/drain contact penetrating the interlayer insulating layer in a third direction that is perpendicular to the first direction and the second direction, the source/drain contact being connected to the source/drain region.

21. A semiconductor device comprising:

a substrate;

an active pattern extending in a first direction on the substrate;

a gate electrode extending in a second direction on the active pattern, the second direction intersecting the first direction;

a gate spacer extending in the second direction along side walls of the gate electrode;

an interlayer insulating layer contacting side walls of the gate spacer;

a trench formed on the gate electrode in the interlayer insulating layer;

a first capping pattern provided along side walls of the trench, at least one side wall of the first capping pattern having an inclined profile, wherein the first capping pattern decreases in width with increased distance from the substrate;

a second capping pattern provided on the first capping pattern in the trench;

a second gate electrode extending in the second direction on the active pattern; and a source/drain contact positioned between the gate electrode and the second gate electrode, wherein the inclined profile of the at least one side wall of the first capping pattern is configured to reduce a capacitance between the gate electrode and the second gate electrode.

22. The semiconductor device of claim 21, wherein an atomic ratio of carbon in the first capping pattern with respect to carbon in the second capping pattern is configured to reduce the capacitance between the gate electrode and the second gate electrode.

* * * * *